(12) United States Patent
Lee et al.

(10) Patent No.: US 10,957,683 B2
(45) Date of Patent: Mar. 23, 2021

(54) INTEGRATED CIRCUIT INCLUDING MULTI-HEIGHT STANDARD CELL AND METHOD OF DESIGNING THE SAME

(71) Applicant: SAMSUNG ELECTRONICS CO., LTD., Suwon-si (KR)

(72) Inventors: Dae-Seong Lee, Busan (KR); Ah-Reum Kim, Daegu (KR); Min-Su Kim, Hwaseong-si (KR); Jong-Kyu Ryu, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 16/250,000

(22) Filed: Jan. 17, 2019

(65) Prior Publication Data
US 2019/0393205 A1 Dec. 26, 2019

(30) Foreign Application Priority Data
Jun. 25, 2018 (KR) .................. 10-2018-0072863

(51) Int. Cl.
| | |
|---|---|
| *H01L 27/02* | (2006.01) |
| *H01L 23/50* | (2006.01) |
| *H01L 27/092* | (2006.01) |
| *G06F 30/392* | (2020.01) |
| *G06F 30/394* | (2020.01) |

(52) U.S. Cl.
CPC ........ *H01L 27/0207* (2013.01); *G06F 30/392* (2020.01); *G06F 30/394* (2020.01); *H01L 23/50* (2013.01); *H01L 27/092* (2013.01)

(58) Field of Classification Search
CPC ... H01L 27/0207; H01L 27/092; H01L 23/50; G06F 30/392; G06F 30/394
See application file for complete search history.

(56) References Cited

U.S. PATENT DOCUMENTS

| | | | |
|---|---|---|---|
| 8,188,549 B2 | 5/2012 | Ishii | |
| 8,856,704 B2 | 10/2014 | Baeg | |
| 8,908,420 B2* | 12/2014 | Asayama | G11C 11/419 |
| | | | 365/154 |
| 9,324,715 B2 | 4/2016 | Azmat et al. | |
| 9,449,970 B2* | 9/2016 | Do | H01L 27/11807 |
| 9,530,780 B2 | 12/2016 | Kim et al. | |
| 9,641,161 B1 | 5/2017 | Liu et al. | |
| 9,946,828 B2* | 4/2018 | Kim | G06F 30/392 |
| 10,249,605 B2* | 4/2019 | Subhash | H01L 27/0207 |
| 10,291,212 B2* | 5/2019 | Kim | H03K 3/35625 |

(Continued)

*Primary Examiner* — Nathan W Ha
(74) *Attorney, Agent, or Firm* — Lee IP Law, PC

(57) ABSTRACT

An integrated circuit includes a semiconductor substrate, first through third power rails, first through third selection gate lines, and a row connection wiring. The first through third power rails on the semiconductor substrate extend in a first direction and arranged sequentially in a second direction perpendicular to the first direction. The first through third selection gate lines on the semiconductor substrate extend in the second direction over a first region between the first power rail and the second power rail and a second region between the second power rail and the third power rail, and are arranged sequentially in the first direction. The row connection wiring on the semiconductor substrate extends in the first direction to connect the first selection gate line and the third selection gate line.

19 Claims, 27 Drawing Sheets

(56) References Cited

U.S. PATENT DOCUMENTS

2011/0302540 A1     12/2011   Kwon et al.
2016/0254256 A1*   9/2016   Baek .................. H01L 23/5283
                                                                               257/401
2017/0077910 A1      3/2017   Kim et al.

\* cited by examiner

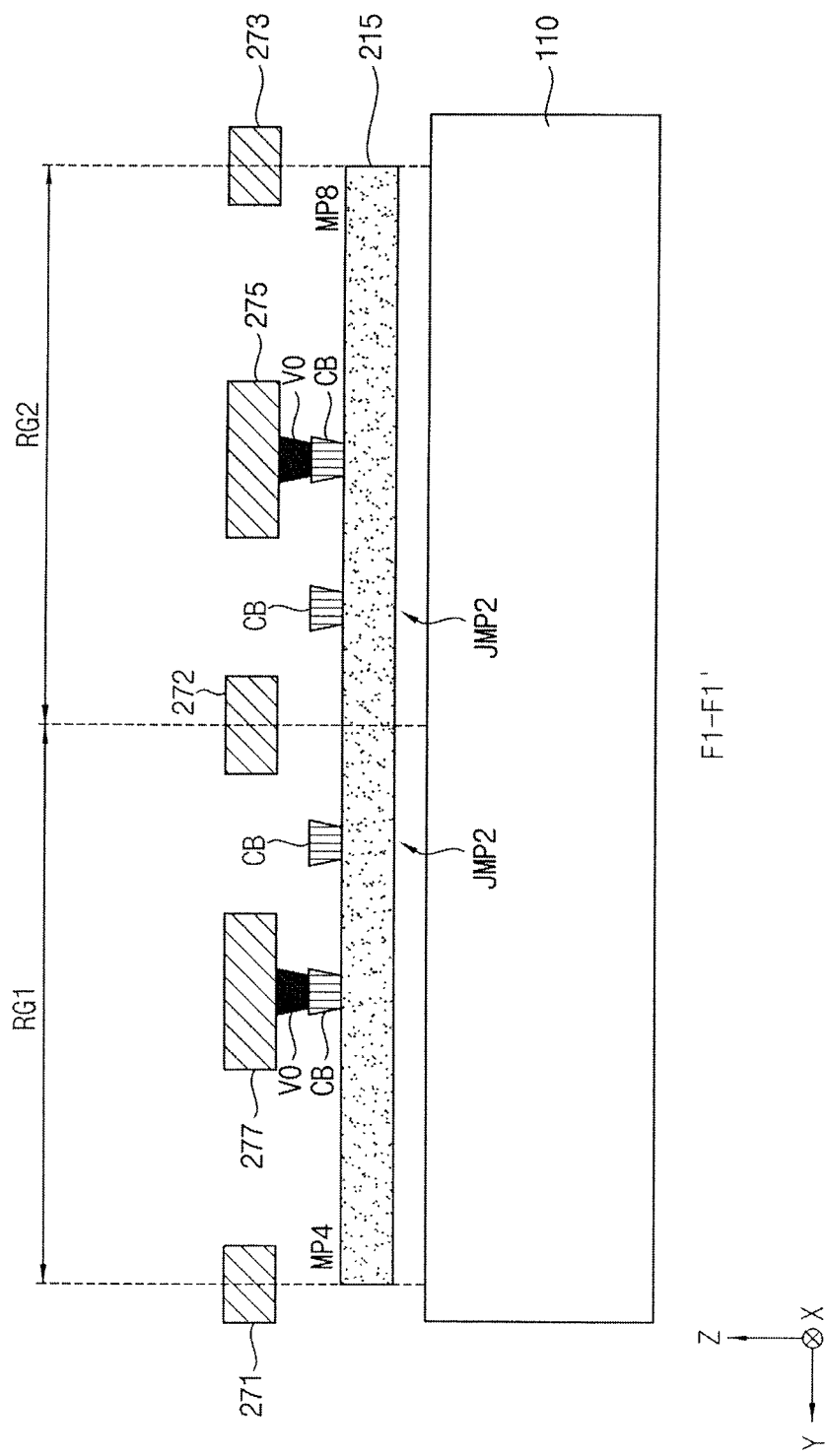

H-H'

INTEGRATED CIRCUIT INCLUDING MULTI-HEIGHT STANDARD CELL AND METHOD OF DESIGNING THE SAME

CROSS-REFERENCE TO RELATED APPLICATION

Korean Patent Application No. 10-2018-0072863, filed on Jun. 25, 2018, in the Korean Intellectual Property Office, and entitled: "Integrated Circuit Including Multi-Height Standard Cell and Method of Designing the Same," is incorporated by reference herein in its entirety.

BACKGROUND

1. Field

Example embodiments relate generally to semiconductor integrated circuits and, more particularly, to an integrated circuit including a multi-height standard cell and a method of designing the integrated circuit.

2. Description of the Related Art

Standard cells having fixed functions may be used in the design of integrated circuits. The standard cells have predetermined architectures and are stored in cell libraries. When designing integrated circuits, the standard cells are retrieved from the cell libraries and placed into desired locations on an integrated circuit layout. Routing is then performed to connect the standard cells with each other and with other cells. A standard cell has a predetermined (or set) architecture, e.g., a cell width, a cell height, a cell length, etc. Design efficiency of an integrated circuit may be determined according to configurations and layout of standard cells.

SUMMARY

According to example embodiments, an integrated circuit includes a semiconductor substrate, a first power rail, a second power rail, a third power rail, a first selection gate line, a second selection gate line, a third selection gate line and a row connection wiring.

The first power rail, the second power rail and the third power rail are over the semiconductor substrate and extend in a first direction and arranged sequentially in a second direction perpendicular to the first direction. The first selection gate line, the second selection gate line and the third selection gate line are over the semiconductor substrate, extend in the second direction to pass through a first region between the first power rail and the second power rail and a second region between the second power rail and the third power rail and are arranged sequentially in the first direction. The row connection wiring is over the semiconductor substrate and extends in the first direction to connect the first selection gate line and the second selection gate line.

According to example embodiments, an integrated circuit includes a first selection transistor to be gated by an inverted voltage level of a second selection signal to pull up a first output node, a second selection transistor configured to be gated by a voltage level of a first selection signal to pull down the first output node, a third selection transistor to be gated by an inverted voltage level of the first selection signal to pull up the first output node, a fourth selection transistor to be gated by a voltage level of the second selection signal to pull down the first output node, a fifth selection transistor to be gated by the inverted voltage level of the second selection signal to pull up a second output node, a sixth selection transistor to be gated by the voltage level of the first selection signal to pull down the second output node, a seventh selection transistor to be gated by the inverted voltage level of the first selection signal to pull up the second output node, an eighth selection transistor gated by the voltage level of the second selection signal to pull down the second output node, a first selection gate line serving as gate electrodes of the second selection transistor and the sixth selection transistor, a second selection gate line serving as gate electrodes of the first selection transistor, the fourth selection transistor, the fifth selection transistor, and the eighth selection transistor, a third selection gate line serving as gate electrodes of the third selection transistor and the seventh selection transistor, and a row connection wiring connecting the first selection gate line and the third selection gate line.

According to example embodiments, a method of designing an integrated circuit, includes, receiving input data defining an integrated circuit, providing, in a standard cell library, at least one multi-height standard cell, performing placement and routing based on the input data and the standard cell library and generating output data defining the integrated circuit based on a result of the placement and the routing. The multi-height standard cell includes a semiconductor substrate, a first power rail, a second power rail, a third power rail, a first selection gate line, a second selection gate line, a third selection gate line and a row connection wiring as described above.

BRIEF DESCRIPTION OF THE DRAWINGS

Features will become apparent to those of skill in the art by describing in detail exemplary embodiments with reference to the attached drawings in which:

FIGS. 9A and 9B illustrate cross-sectional views of the standard cell of FIG. 8 according to example embodiments.

DETAILED DESCRIPTION

Figure 1:
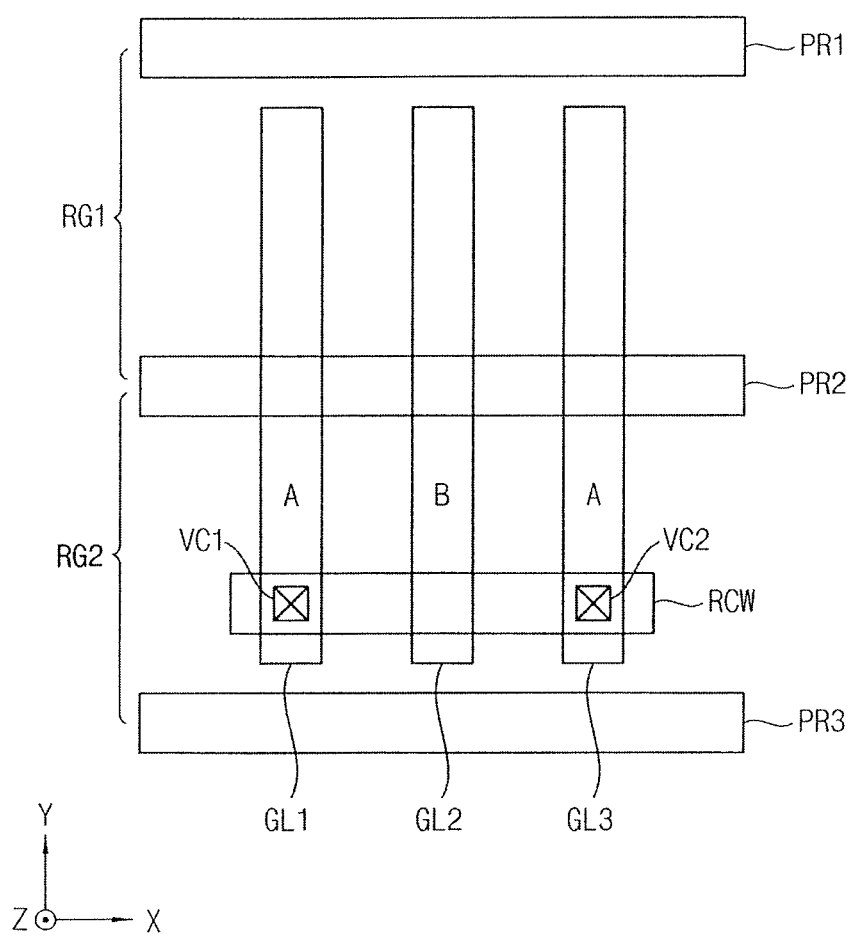
FIG. 1 illustrates a plan view of an integrated circuit according to example embodiments.

Various example embodiments will be described more fully hereinafter with reference to the accompanying drawings, in which some example embodiments are shown. In the drawings, like numerals refer to like elements throughout. The repeated descriptions may be omitted.

Hereinafter, structures of an integrated circuit according to example embodiments are described using a first direction X, a second direction Y, and a third direction Z in a three-dimensional space. The first direction X may be a row direction, the second direction Y may be a column direction, and the third direction Z may be a vertical direction. The first direction X, the second direction Y, and the third direction Z may intersect, e.g., may be orthogonal or perpendicular to one another.

FIG. 1 is a diagram illustrating a layout of an integrated circuit according to example embodiments. Referring to FIG. 1, an integrated circuit 200 may include a first power rail PR1, a second power rail PR2, a third power rail PR3, a first selection gate line GL1, a second selection gate line GL2, third selection gate line GL3, and a row connection wiring RCW.

The first power rail PR1, the second power rail PR2, and the third power rail PR3 are formed over a semiconductor substrate and extend in the first direction X. The first power rail PR1, the second power rail PR2, and the third power rail PR3 are spaced apart from each other and arranged sequentially in the second direction Y.

The first selection gate line GL1, the second selection gate line GL2, and the third selection gate line GL3 are formed over the semiconductor substrate, and extend in the second direction Y to pass through, e.g., extend over, a first region RG1, between the first power rail PR1 and the second power rail PR2, and a second region RG2, between the second power rail PR2 and the third power rail PR3. The first selection gate line GL1, the second selection gate line GL2, and the third selection gate line GL3 are spaced apart from each other and arranged sequentially in the first direction X.

The row connection wiring RCW is formed over the semiconductor substrate and extends in the first direction X over the first selection gate line GL1, the second selection gate line GL2, and the third selection gate line GL3. The row connection wiring RCW may be in a metal layer over the gate lines GL1, GL2, and GL3. The row connection wiring RCW may be connected to the first selection gate line GL1 and the third selection gate line GL3 via vertical contacts VC1 and VC2.

Through such routing of the gate lines GL1, GL2, and GL3 and the row connection wiring RCW, selection nodes may receive selection signals. For example, the first selection gate line GL1, the third selection gate line GL3, and the row connection wiring RCW may form a first selection node receiving a first selection signal A, and the second selection gate line GL2 may form a second selection node receiving a second selection signal B.

FIG. 1 illustrates a double-height standard cell having the first selection gate line GL1, the second selection gate line GL2, and the third selection gate line GL3 in two adjacent regions RG1 and RG2 defined by the three power rails PR1, PR2, and PR3. However, example embodiments may be applied to a layout of a multi-height standard cell in which the first selection gate line GL1, the second selection gate line GL2, and the third selection gate line GL3 are in two or more adjacent regions defined by three or more power rails.

As such, the integrated circuit may occupy a smaller area and performance of the integrated circuit may be enhanced using the multi-height standard cell including the selection nodes by efficient routing of the gate lines and the connection wirings.

Figure 2:
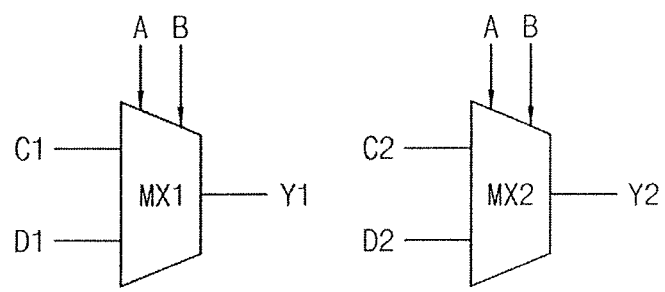
FIG. 2 illustrates an example embodiment of an integrated circuit applicable to the layout of FIG. 1.

FIG. 2 is a diagram illustrating an example embodiment of an integrated circuit applicable to the layout of FIG. 1. Referring to FIG. 2, an integrated circuit 201 may include a first multiplexer MX1 and a second multiplexer MX2. The first multiplexer MX1 may select one of a first input signal C1 and a second input signal D1, based on a first selection signal A and a second selection signal B, to output a first output signal Y1. The second multiplexer MX2 may select on of a third input signal C2 and a fourth input signal D2, based on the first selection signal A and the second input signal B, to output a second output signal Y2.

Referring to FIGS. 1 and 2, the first multiplexer MX1 may be formed in the first region RG1 between the first power rail PR1 and the second power rail PR2, and the second multiplexer MX2 may be formed in the second region RG2 between the second power rail PR2 and the third power rail PR3. The first multiplexer MX1 and the second power rail PR2 may receive the first selection signal A and the second selection signal B commonly. The first selection signal A may be applied commonly to the first multiplexer MX1 and the second multiplexer MX2 through the first selection node formed by connecting the first selection gate line GL1, the third selection gate line GL3, and the row connection wiring RCW. The second selection signal B may be applied commonly to the first multiplexer MX1 and the second multiplexer MX2 through the second selection node formed by the second selection gate line GL2.

Figure 3:
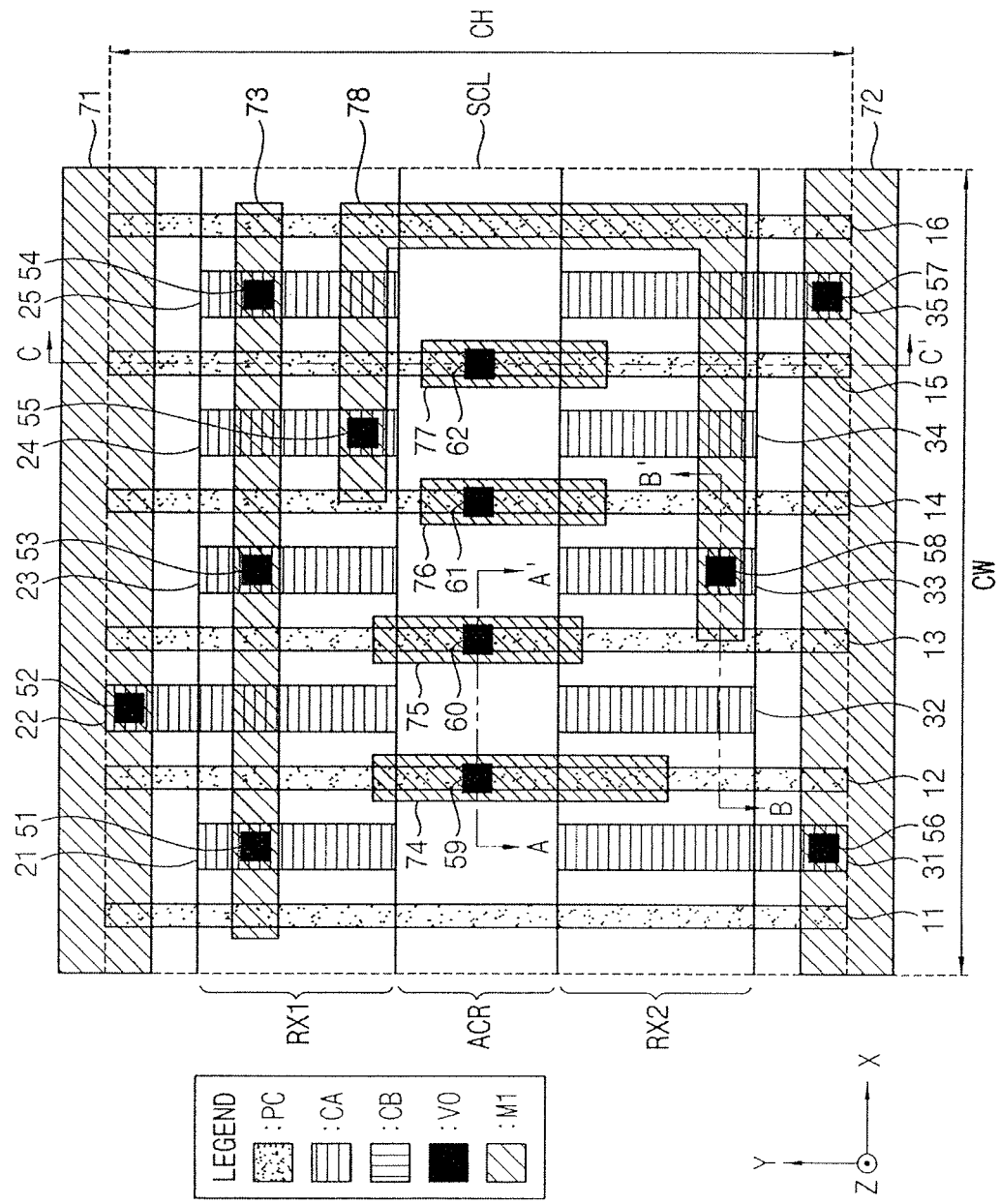
FIG. 3 illustrates a plan view of an example standard cell.

Hereinafter, an example structure of a standard cell is described with reference to FIGS. 3, 4A, 4B and 4C. FIG. 3 is a diagram illustrating a layout of an example standard cell, and FIGS. 4A, 4B and 4C are cross-sectional views of the standard cell of FIG. 3.

Figure 4A:
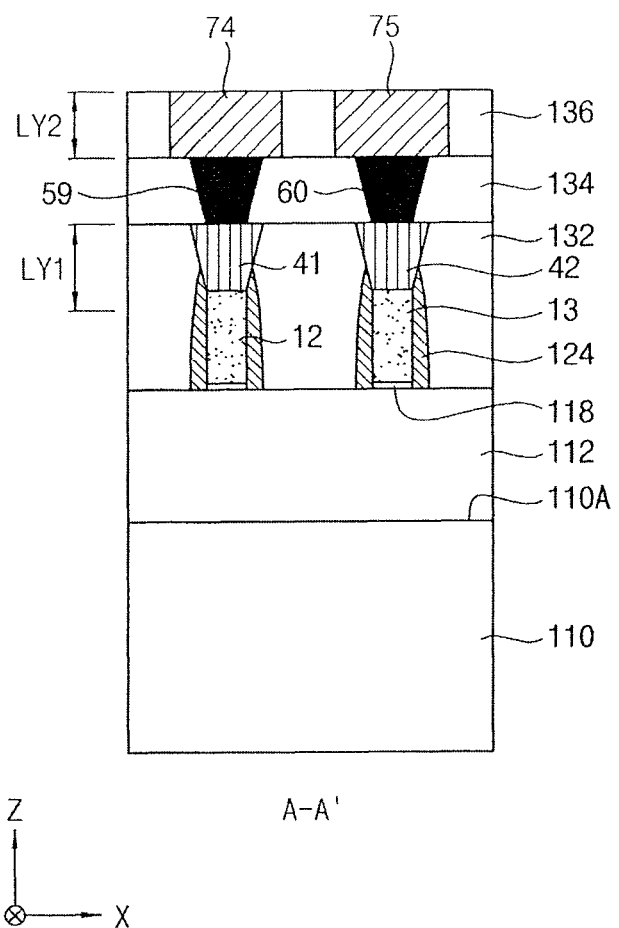
FIGS. 4A, 4B and 4C illustrate cross-sectional views of a standard cell of FIG. 3.
Figure 4B:
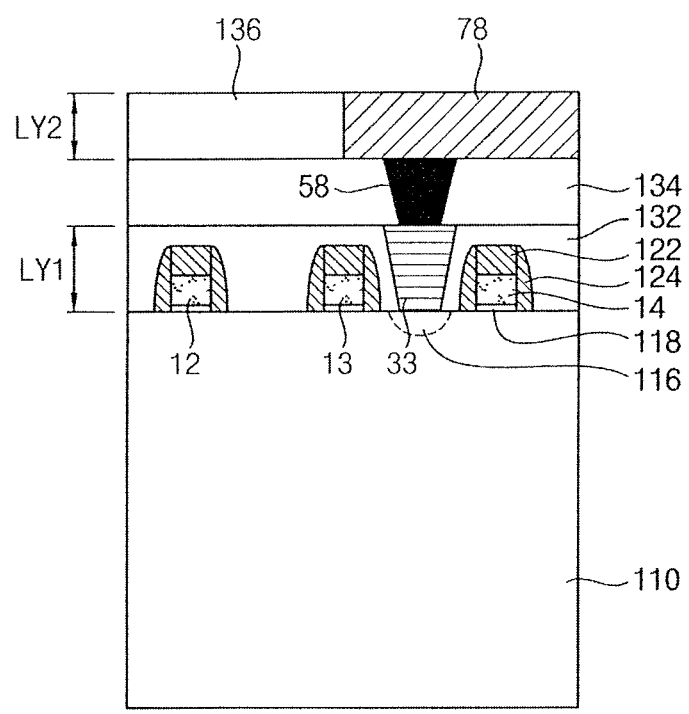
Figure 4C:
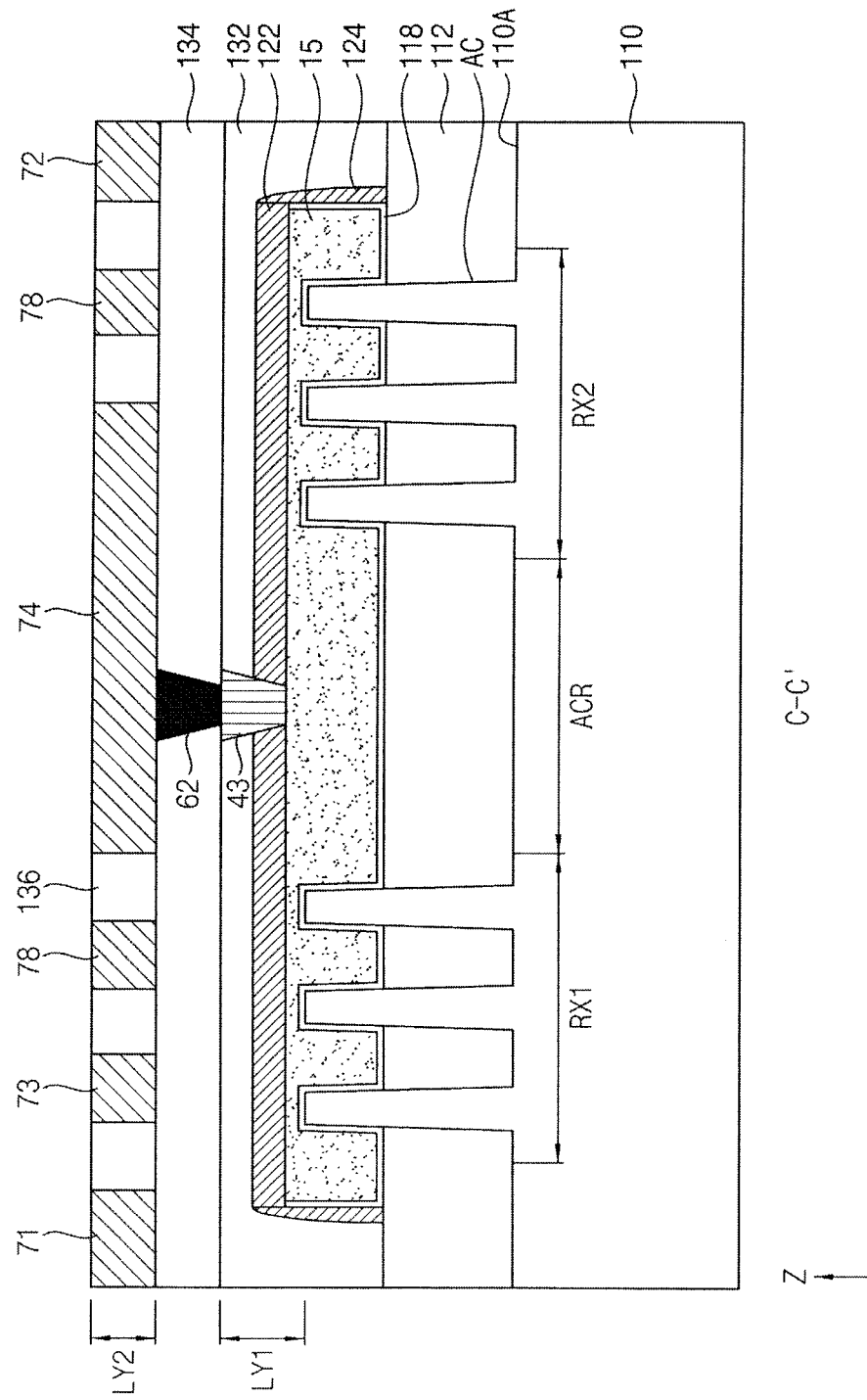

FIGS. 4A, 4B, and 4C illustrate a portion of a standard cell SCL that includes a fin field effect transistor (FinFET). FIG. 4A is a cross-sectional view of the standard cell SCL of FIG. 3 along a line A-A'. FIG. 4B is a cross-sectional view of the standard cell SCL of FIG. 3 along a line B-B'. FIG. 4C is a cross-sectional view of the standard cell SCL of FIG. 3 along a line C-C'.

Referring to FIGS. 3, 4A, 4B, and 4C, the standard cell SCL may be formed on a substrate 110 having an upper surface 110A that extends in a horizontal direction, e.g., the first direction X and the second direction Y.

In some example embodiments, the substrate 110 may include a semiconductor, e.g., silicon (Si), germanium (Ge), and the like, or a compound semiconductor, e.g., SiGe, SiC, GaAs, InAs, InP, and the like. In some example embodiments, the substrate 110 may have a silicon on insulator (SOI) structure. The substrate 110 may include a conductive area, e.g., an impurity-doped well or an impurity-doped structure.

The standard cell SCL may include a first device area RX1, a second device area RX2, and an active cut area ACR separating the first and second device areas RX1 and RX2 along the second direction Y. Each of the first and second device areas RX1 and RX2 may include a plurality of fin-type active areas AC protruding along the third direction Z from the substrate 110 (See FIG. 4C).

The plurality of active areas AC may extend in parallel to one another in the first direction X. A device isolation layer 112 may be between the plurality of active areas AC on the substrate 110 along the second direction Y. The plurality of active areas AC protrude from the device isolation layer 112 along the third direction Z in the form of fins.

A plurality of gate insulation layers 118 and a plurality of gate lines PC 11, 12, 13, 14, 15, and 16 may be formed on the substrate 110. The gate lines PC 11, 12, 13, 14, 15 and 16 may extend in the direction Y crossing the plurality of active areas AC. The plurality of gate insulation layers 118 and the plurality of gate lines PC 11, 12, 13, 14, 15, and 16 may cover an upper surface and sidewalls of each of the active areas AC and an upper surface of the device isolation layer 112. In particular, the plurality of gate insulation layers 118 may be on, e.g., directly on, the upper surface of the device isolation layer 112 and may be on, e.g., directly on, the upper surface and sidewalls of each of the active areas AC that extend along the third direction Z from the upper surface of the device isolation layer 112

A plurality of metal oxide semiconductor (MOS) transistors may be formed along the plurality of gate lines PC 11, 12, 13, 14, 15 and 16. The MOS transistors may have a three-dimensional structure in which channels are formed in the upper surface and the two sidewalls of the active areas AC.

The gate insulation layers 118 may be formed of a silicon oxide layer, a high-k dielectric layer, or a combination thereof. The plurality of gate lines PC 11, 12, 13, 14, 15, and 16 may extend on the gate insulation layers 118 across the plurality of active areas AC while covering the upper surface and the two sidewalls of each of the active areas AC.

A mask 122 may be formed on each of the gate lines PC 11, 12, 13, 14, 15, and 16. Side walls of the insulation layer 118, the gate line PC, and the mask 122 may be covered by a spacer 124. In particular, the spacer 124 may extend along the insulation layer 118, the gate line PC, and the mask 122 along the third direction Z. In the cross-section shown in FIG. 4C, the insulation layer 118 may extend along the third direction Z between the gate line PC and the spacer 124.

The gate lines PC 11, 12, 13, 14, 15, and 16 may have a structure in which a metal nitride layer, a metal layer, a conductive capping layer, and a gap-fill metal layer are sequentially stacked. The metal nitride layer and the metal layer may include titanium (Ti), tantalum (Ta), tungsten (W), ruthenium (Ru), niobium (Nb), molybdenum (Mo), hafnium (Hf), and the like. The metal layer and the metal nitride layer may be formed, e.g., by using an atomic layer deposition (ALD) method, a metal organic ALD method, and/or a metal organic chemical vapor deposition (MOCVD) method. The conductive capping layer may function as a protection layer that prevents oxidization of a surface of the metal layer. In addition, the conductive capping layer may function as an adhesive layer (e.g., a wetting layer) that facilitates deposition of another conductive layer on the metal layer. The conductive capping layer may be formed of a metal nitride, e.g., a TiN, TaN, a combination thereof, and the like. The gap-fill metal layer may fill spaces between the active areas AC and extend on the conductive capping layer. The gap-fill metal layer may be formed of a W (e.g., tungsten) layer. The gap-fill metal layer may be formed, e.g., by using an ALD method, a CVD method, or a physical vapor deposition (PVD) method.

A plurality of conductive contacts CA and CB may be on a first layer LY1 on the active areas AC. The plurality of conductive contacts CA and CB include a plurality of first contacts CA 21, 22, 23, 24, 25, 31, 32, 33, 34, and 35 connected to a source/drain area 116 of the active areas AC (See FIG. 4B) and a plurality of second contacts CB 41, 42, and 43 connected to the gate lines 11, 12, 13, 14, 15, and 16 (See FIGS. 4A and 4C).

The plurality of conductive contacts CA and CB may be insulated from each other by a first interlayer insulation layer 132 that covers the active areas AC and the gate lines GL. The plurality of conductive contacts CA and CB may have an upper surface that is at substantially the same level as an upper surface of the first interlayer insulation layer 132. The first interlayer insulation layer 132 may be a silicon oxide layer.

A second interlayer insulation layer 134 and a plurality of lower via contacts V0 51, 52, 53, 54, 55, 56, 57, 58, 59, 60, 61, and 62 that pass through the second interlayer insulation layer 134 are on the first interlayer insulation layer 132. The second interlayer insulation layer 134 may be a silicon oxide layer.

A plurality of wirings M1 71, 72, 73, 74, 75, 76, 77, and 78 extending in the first direction X on a second layer LY2, which is higher than the first layer LY1, e.g., further from the substrate 110 along the third direction Z, may be on the second interlayer insulation layer 134. Each of the wirings M1 may be connected to one of the plurality of conductive contacts CA and CB through one of the plurality of lower via contacts V0 formed between the first layer LY1 and the second layer LY2. Each of the plurality of lower via contacts V0 may be connected to one of the plurality of conductive contacts CA and CB. e.g., by passing through the second interlayer insulation layer 134. The plurality of lower via contacts V0 may be insulated from one another by the second interlayer insulation layer 134.

The wirings 71~78 may include an internal connection wiring that electrically connects a plurality of areas in the standard cell SCL. For example, the internal connection wiring 78 may electrically connect the active area AC in the first device area RX1 and the active area AC in the second device area RX2 through the lower via contacts 55 and 58 and the first contacts 24 and 33.

Wirings 71 and 72 may correspond to the first power rail PR1 and the second power rail PR2, respectively. The first power rail 71 may be connected to the active area AC in the first device area RX1. The second power rail 72 may be connected to the active area AC in the second device area RX2. One of the first and second power rails 71 and 72 may be a wiring for supplying a power supply voltage (e.g., the first power supply voltage VDD) and the other of the first and second power rails 71 and 72 may be a wiring for supplying a ground voltage (e.g., the second power supply voltage VSS).

The first power rail 71 and the second power rail 72 may extend in the first direction X parallel to one another on the second layer LY2. In some example embodiments, the power rails 71 and 72 may be formed at substantially the same time with the other wirings 73~78. The wirings M1 may be pass through a third interlayer insulation layer 136. The third interlayer insulation layer 136 may insulate the wirings M1 from one another.

A cell height CH of the standard cell SCL may be defined by the distance along the second direction Y between the first power rail 71 and the second power rail 72. A cell width CW of the standard cell SCL may be defined along the first direction X that is parallel to the power rails 71 and 72.

The pitch of the wirings M1 may have to meet limitations due to a minimum spacing rule. For example, the wirings M1 may have to meet limitations according to a "tip-to-side" restriction and a "corner rounding" restriction. The size, disposition, and spacing of the wirings M1 may be limited by such restrictions.

The lower via contacts V0 and the wirings M1 may have a stacked structure of a barrier layer and a wiring conductive layer. The barrier layer may be formed of, e.g., TiN, TaN, a combination thereof, and so forth. The wiring conductive layer may be formed, e.g., of W, Cu, an alloy thereof, a combination thereof, and so forth. A CVD method, an ALD method, and/or an electroplating method may be used to form the wirings M1 and the lower via contacts V0.

The integrated circuit according to some example embodiments may correspond to a combination of various standard cells. Hereinafter, the same reference marks or numerals may be used to indicate a signal and a node of the signal. For example, "A" may be used to indicate a first selection signal or a first selection node to which the first selection signal is applied.

Figure 5:
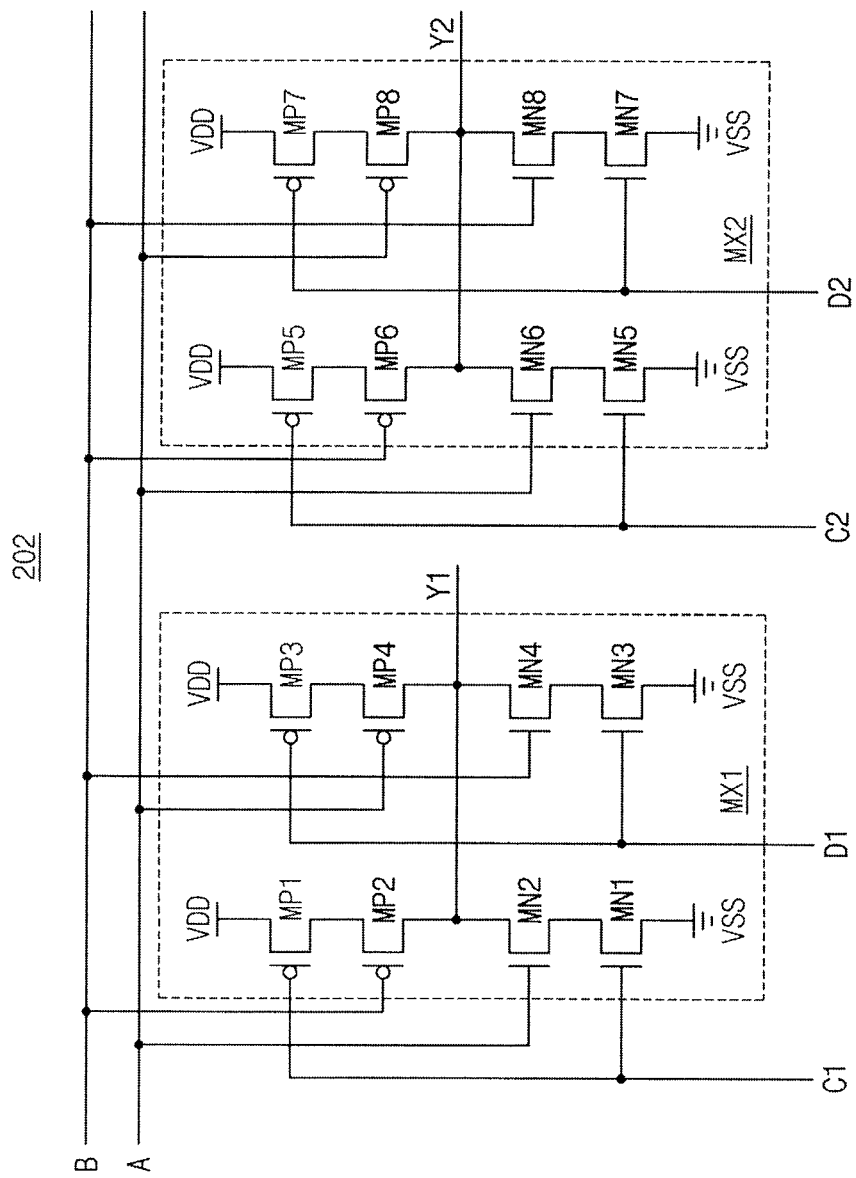
FIG. 5 illustrates a circuit diagram of an integrated circuit according to example embodiments.

FIG. 5 is a circuit diagram illustrating an integrated circuit according to example embodiments. Referring to FIG. 5, an integrated circuit 202 may include the first multiplexer MX1 and the second multiplexer MX2. The first multiplexer MX1 may select one of the first input signal C1 and the second input signal D1 based on the first selection signal A and the second selection signal B to output the first output signal Y1. The second multiplexer MX2 may select one of the third input signal C2 and the fourth input signal D2 based on the first selection signal A and the second input signal B to output the second output signal Y2.

The first multiplexer MX1 may include a first input transistor MP1, a second input transistor MN1, a third input transistor MP3 and a fourth input transistor MN3, a first selection transistor MP2, a second selection transistor MN2, a third selection transistor MP4 and a fourth selection transistor MN4.

The first selection transistor MP2 is gated, e.g., is controlled at a gate electrode thereof, by an inverted voltage level of the second selection signal B to pull up a first output node Y1 generating the first output signal Y1. The second selection transistor MN2 is gated by a voltage level of the first selection signal A to pull down the first output node Y1. The third selection transistor MP4 is gated by an inverted voltage level of the first selection signal A to pull up the first output node Y1. The fourth selection transistor MN4 is gated by a voltage level of the second selection signal B to pull down the first output node Y1.

The first input transistor MP1 is gated by an inverted voltage level of the first input signal C1 to connect the first selection transistor MP2 to a power supply voltage VDD. The second input transistor MN1 is gated by a voltage level of the first input signal C1 to connect the second selection transistor MN2 to a ground voltage VSS. The third input transistor MP3 is gated by an inverted voltage level of the second input signal D1 to connect the third selection transistor MP4 to the power supply voltage VDD. The fourth input transistor MN3 is gated by a voltage level of the second input signal D1 to connect the fourth selection transistor MN4 to the ground voltage VSS.

The second multiplexer MX2 may include a fifth input transistor MP5, a sixth input transistor MN5, a seventh input transistor MP7, an eighth input transistor MN7, a fifth selection transistor MP6, a sixth selection transistor MN6, a seventh selection transistor MP8, and an eighth selection transistor MN8.

The fifth selection transistor MP6 is gated by the inverted voltage level of the second selection signal B to pull up a second output node Y2 generating the second output signal Y2. The sixth selection transistor MN6 is gated by the voltage level of the first selection signal A to pull down the second output node Y2. The seventh selection transistor MP8 is gated by the inverted voltage level of the first selection signal A to pull up the second output node Y2. The eighth selection transistor MN8 is gated by the voltage level of the second selection signal B to pull down the second output node Y2.

The fifth input transistor MP5 is gated by an inverted voltage level of the third input signal C2 to connect the fifth selection transistor MP6 to the power supply voltage VDD. The sixth input transistor MN5 is gated by a voltage level of the third input signal C2 to connect the sixth selection transistor MN6 to the ground voltage VSS. The seventh input transistor MP7 is gated by an inverted voltage level of the fourth input signal D2 to connect the seventh selection transistor MP8 to the power supply voltage VDD. The eighth input transistor MN7 is gated by a voltage level of the fourth input signal D2 to connect the eighth selection transistor MN8 to the ground voltage VSS.

Figure 6:
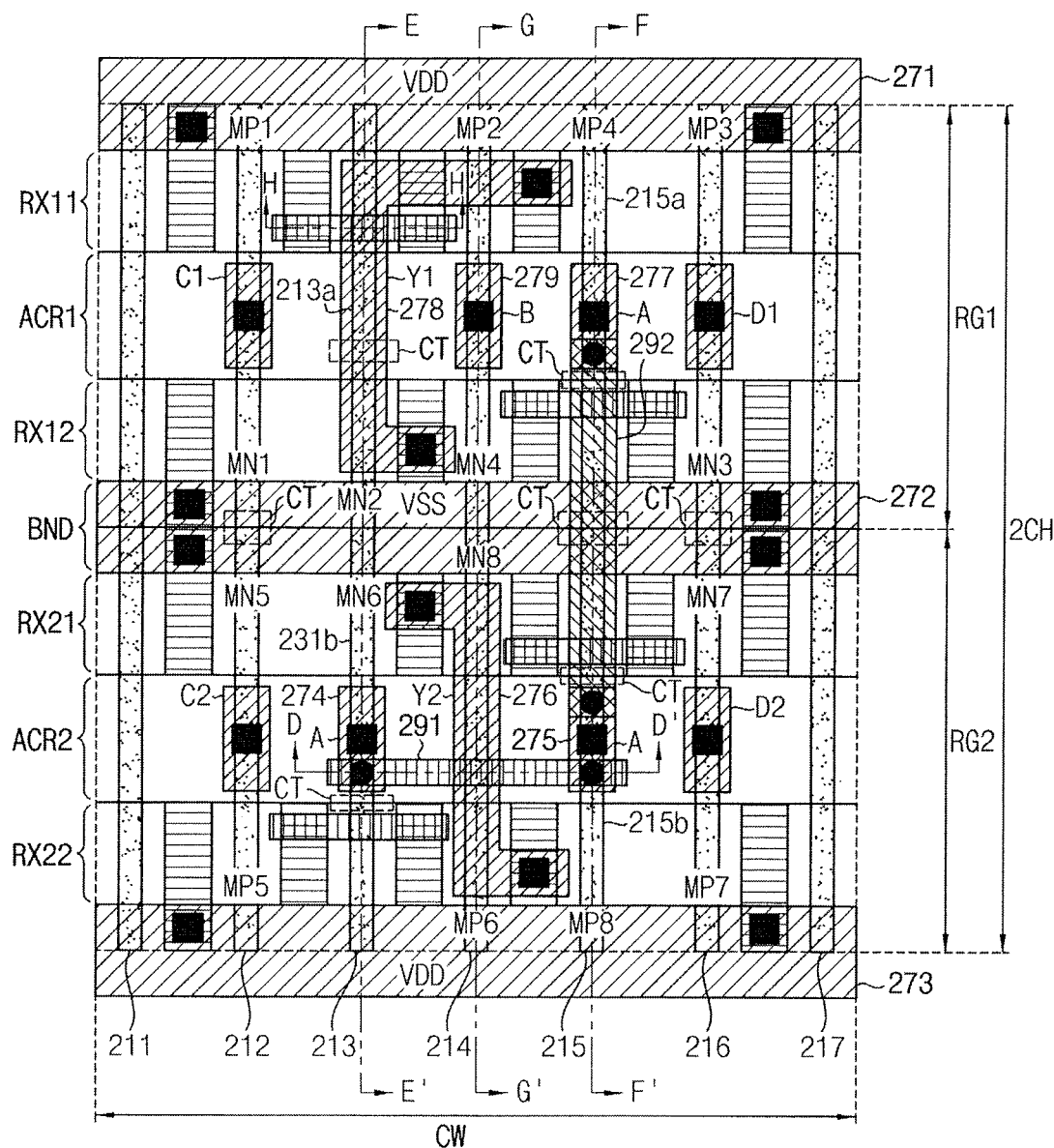
FIG. 6 illustrates a plan view of an example embodiment of a layout of a standard cell corresponding to the integrated circuit of FIG. 5.
Figure 6:
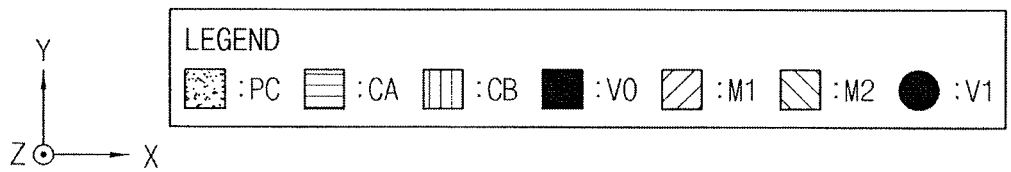
Figure 7A:
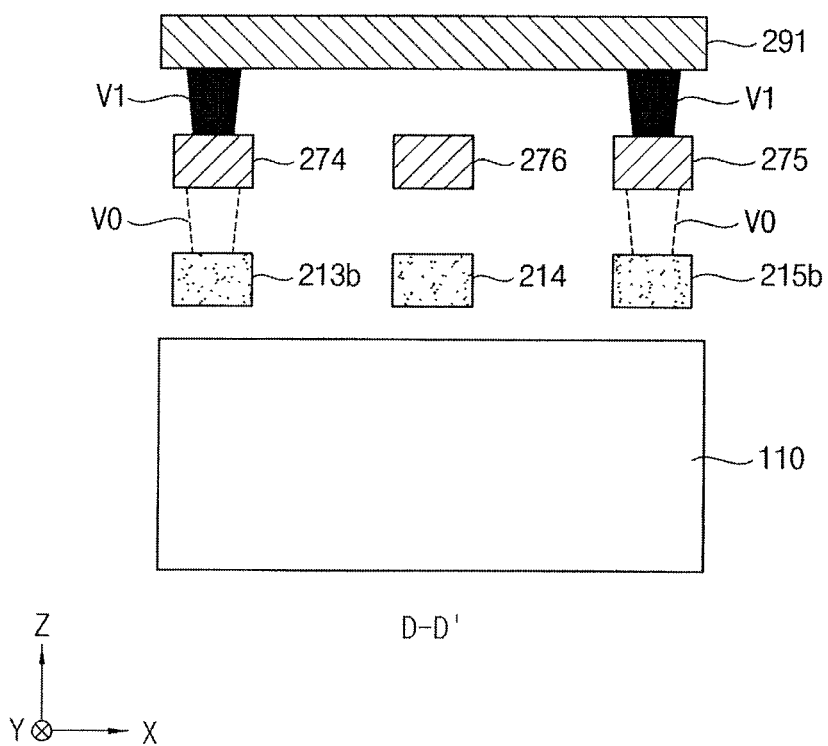
FIGS. 7A, 7B, 7C, 7D, and 7E illustrate cross-sectional views of the standard cell of FIG. 6 according to example embodiments.
Figure 7B:
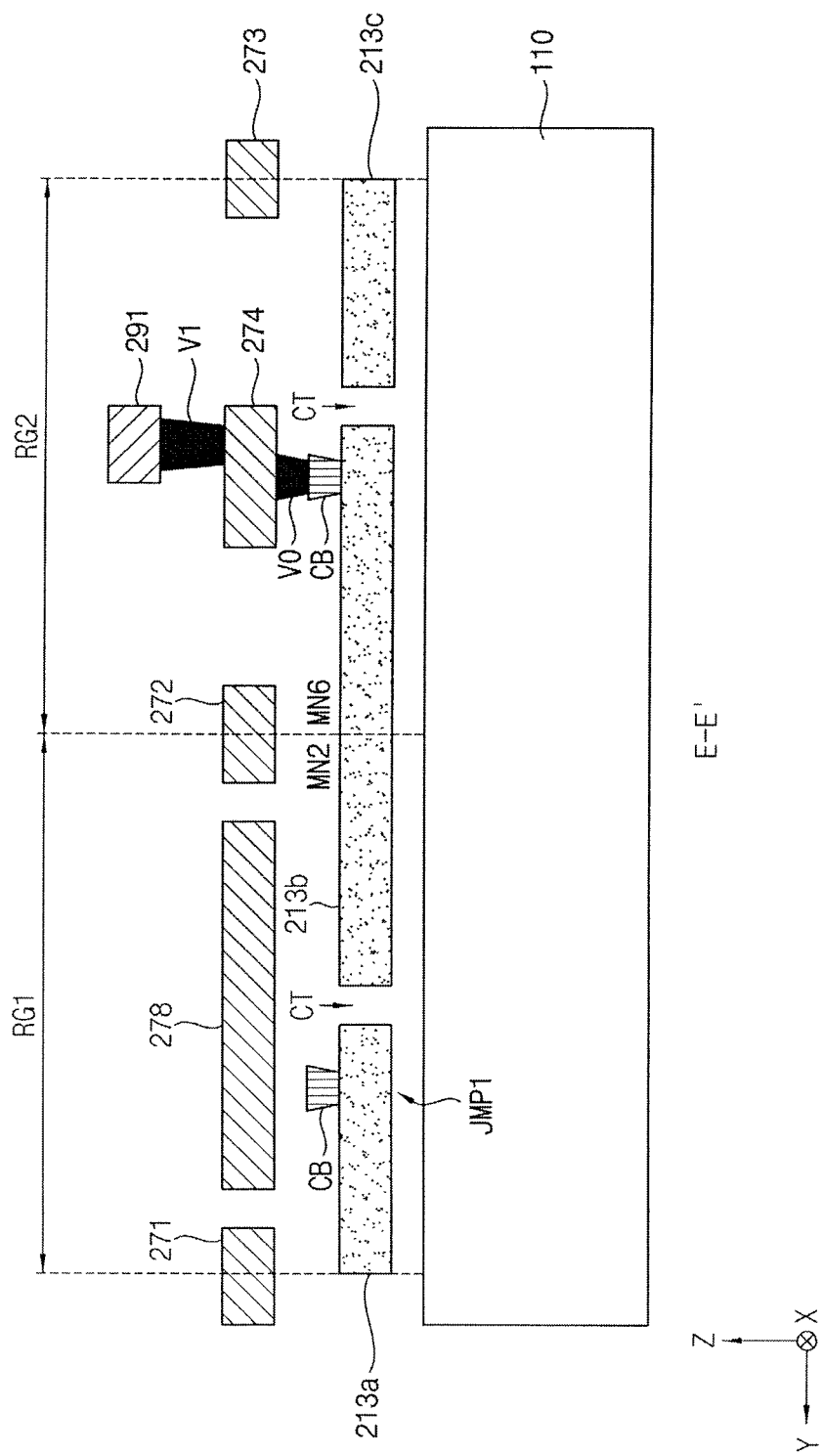
Figure 7C:
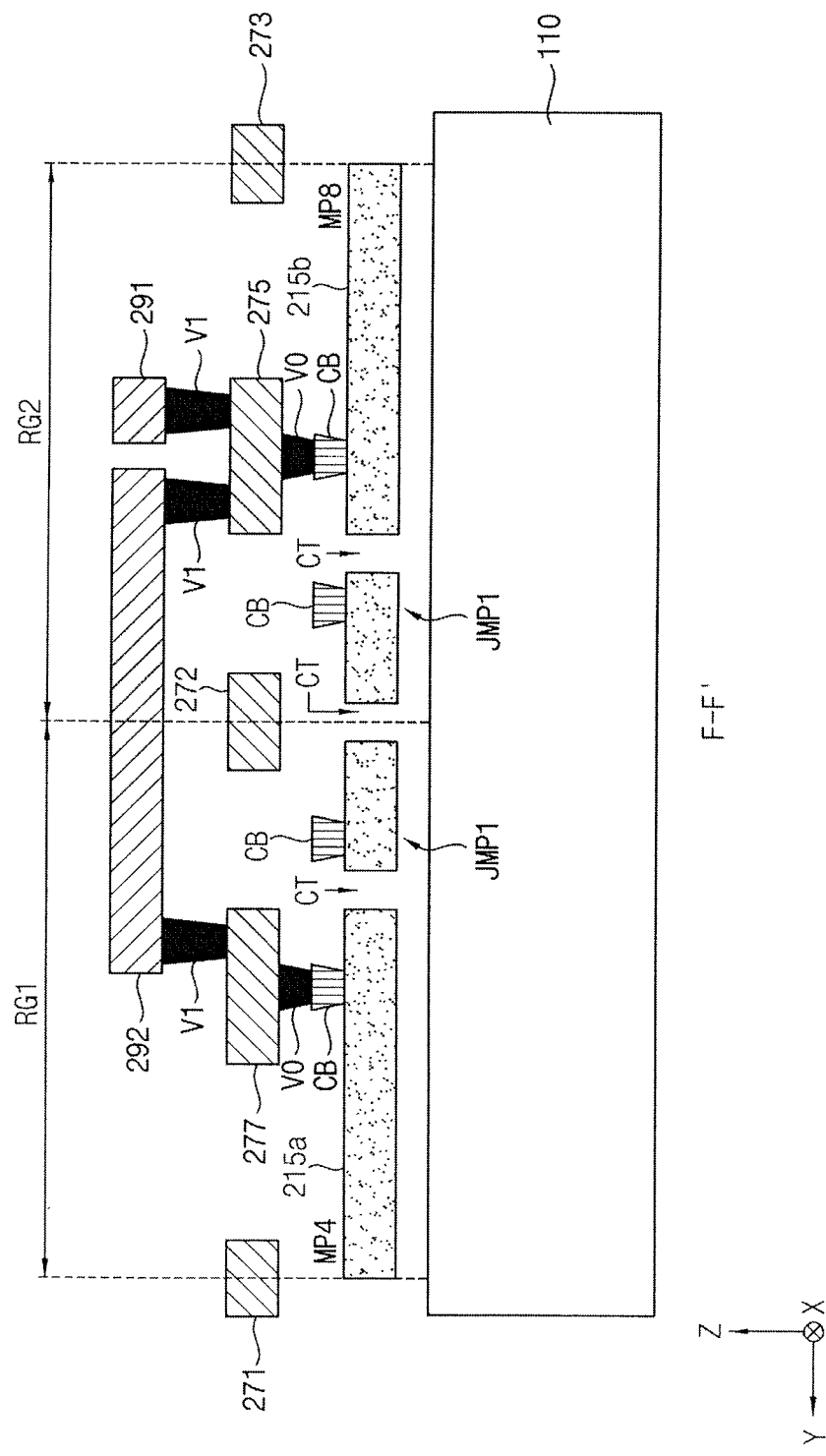
Figure 7D:
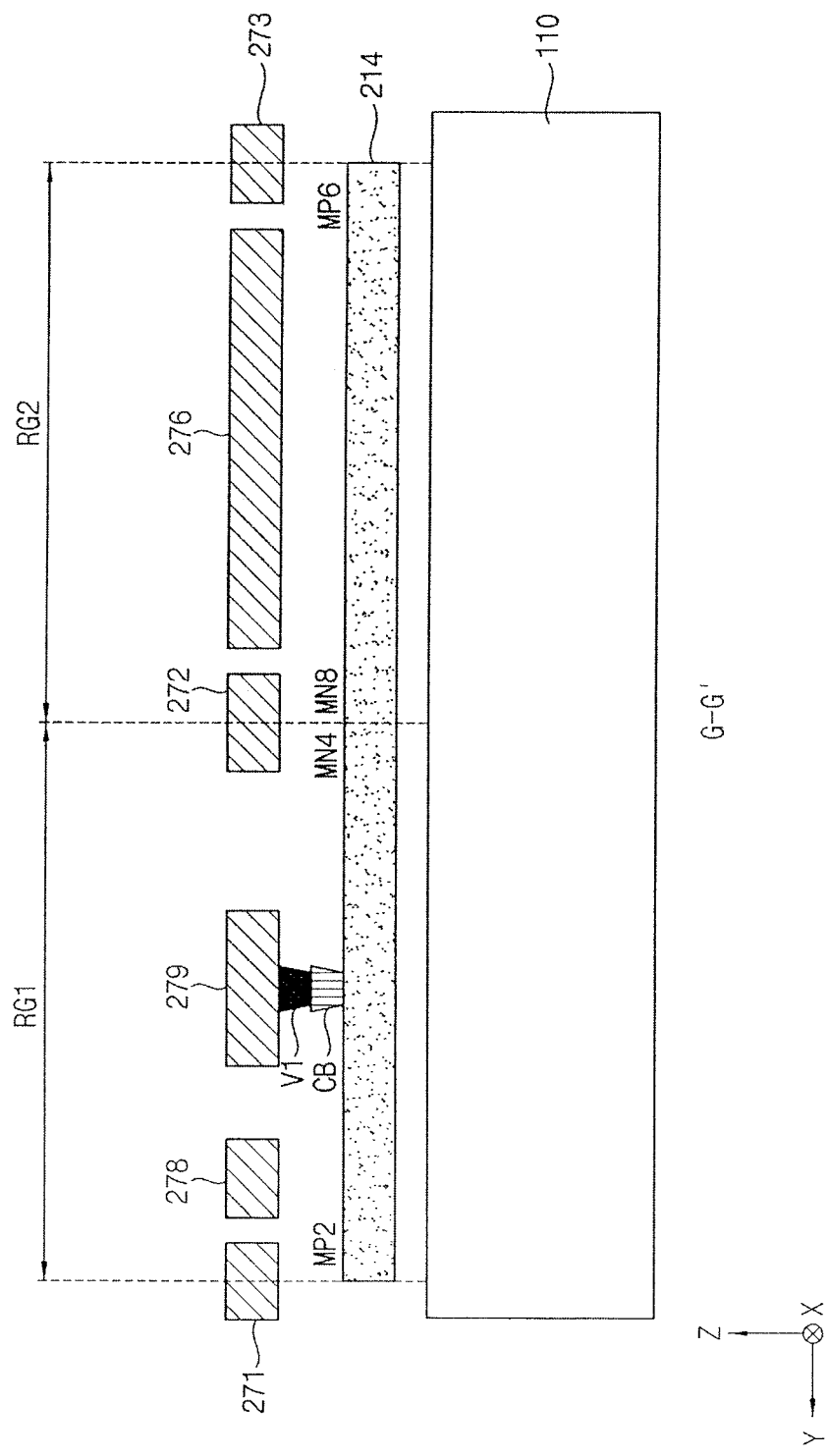
Figure 7E:
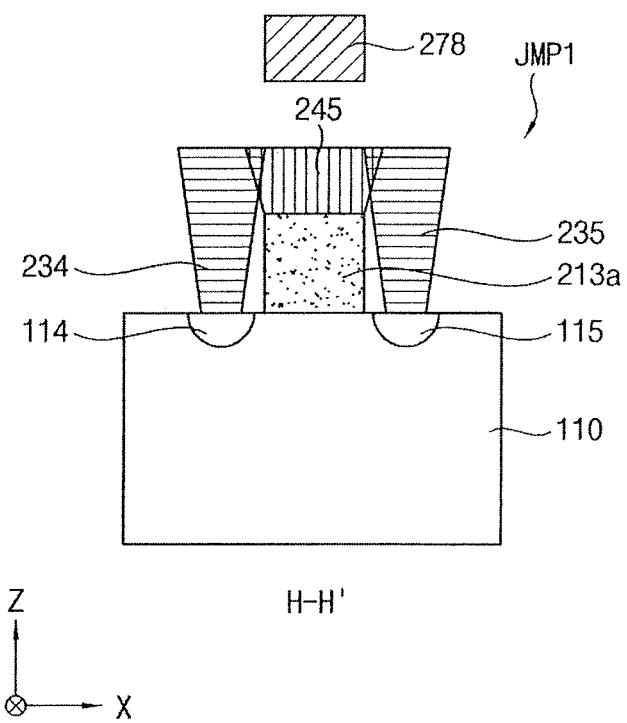

FIG. 6 is a diagram illustrating an example embodiment of a layout of a standard cell corresponding to the integrated circuit of FIG. 5, and FIGS. 7A, 7B, 7C, 7D, and 7E are cross-sectional views of the standard cell of FIG. 6 according to example embodiments. FIG. 7A is a cross-sectional view of the standard cell SCL of FIG. 6 along a line D-D'. FIG. 7B is a cross-sectional view of the standard cell SCL of FIG. 6 along a line E-E'. FIG. 7C is a cross-sectional view of the standard cell SCL of FIG. 6 along a line F-F'. FIG. 7D is a cross-sectional view of the standard cell SCL of FIG. 6 along a line G-G'. FIG. 7E is a cross-sectional view of the standard cell SCL of FIG. 6 along a line H-H'. The descriptions that duplicate those of FIGS. 3, 4A, 4B and 4C may be omitted.

Referring to FIGS. 6, 7A, 7B, 7C, 7D, and 7E, a standard cell in a semiconductor substrate may include a first power rail 271, a second power rail 272, a third power rail 273, a first selection gate line 213, a second selection gate line 214, a third selection gate line 215, a first input gate line 212, a second input gate line 216, dummy gate lines 211 and 217, wirings 274~279 in a first metal layer M1, a row connection wiring 291, and column connection wiring 292 in a second metal layer M2.

The conductive contacts CA and CB and the wirings in the first metal layer M1 may be connected through lower via contacts V0, and the wirings in the first metal layer M1 and the wirings in the second metal layer M2 may be connected through upper via contacts V1. The first metal layer M1 may be the lowest metal layer or have at least one metal layer under the first metal layer M1. The first metal layer M1 and the second metal layer M2 may be adjacent in the third direction Z or at least one metal layer may be between the first metal layer M1 and the second metal layer M2. The power rails 271, 272, and 273 may be in the first metal layer M1 as illustrated in FIGS. 6, 7A, 7B, 7C, 7D, and 7E.

At least one of the gate lines 211~217 may be cut or separated by a gate cut region CT so that the gate line may include a plurality of gate segments. For example, the first selection gate line 213 may include a first gate segment 213a and a second gate segment 213b, and the third selection gate line 215 may include a first gate segment 215a and a second gate segment 215b.

The first multiplexer MX1 including the first through fourth input transistors MP1, MN1, MP3, and MN3, and the first through fourth selection transistors MP2, MN2, MP4, and MN4 may be in the first region RG1 between the first power rail 271 and the second power rail 272. The second multiplexer MX2 including the fifth through eighth input transistors MP5, MN5, MP7, and MN7, and the fifth through eighth selection transistors MP6, MN6, MP8, and MN8 may be in the second region RG2 between the second power rail 272 and the third power rail 273. As such, the standard cell of FIG. 6 may have a cell height 2CH that is double a cell height CH of normal standard cells, e.g., as shown in FIG. 3, and the standard cell of FIG. 6 may be referred to as a double-height standard cell. In general, a standard cell having a cell height N*CH that is N times (N is an integer greater than one) the normal cell height CH may be referred to as a multi-height standard cell.

The first region RG1 may include a first device area RX11, a second device area RX12, and a first active cut area ACR1. The second region RG2 may include a third device area RX21, a fourth device area RX22, and a second active cut area ACR2. The region between the first region RG1 and the second region RG2 may be referred to as a boundary region BND.

The first multiplexer MX1 may include a first output wiring 278 in the second metal layer M2 to provide the first output signal Y1. As illustrated in FIG. 6, a column extending portion of the first output wiring 278 may be disposed over the first selection gate line 213 along the first selection gate line 213.

The second multiplexer MX2 may include a second output wiring 276 in a first metal layer M1 to provide the second output signal Y2. As illustrated in FIG. 6, a portion of the second output wiring 276 may extend along the second direction Y over the second selection gate line 214 along the third selection gate line 215. The row connection wiring 291 may be in the second metal layer M2. Thus, the row connection wiring 291 extending in the first direction X may cross the column extending portion of the second output wiring 276, which extends in the second direction Y.

As illustrated in FIG. 6, the power supply voltage VDD may be applied to the first power rail 271 and the third power rail 273, and the ground voltage VSS may be applied to the second power rail 272. In this case, the P-type transistors MP1~MP8 may be formed in the first and third device areas RX11 and RX21, and the N-type transistors MN1~MN8 may be formed in the second and fourth device areas RX12 and RX22.

The row connection wiring 291 may connect the first selection gate line 213 and the third selection gate line 215. For example, as illustrated in FIGS. 6 and 7A, the row connection wiring 291 may be connected to the second gate segment 213b of the first selection gate line 213 and the second gate segment 215b of the third selection gate line 215. FIGS. 6 and 7A illustrate that the row connection wiring 291 is connected to the first and third gate selection lines 213 and 215 through the upper via contacts V1, the wirings 271 and 275 in the second metal layer M2 and the lower via contacts V0.

As illustrated in FIG. 6, the first selection gate line 213 may form gate electrodes of the second selection transistor MN2 and the sixth selection transistor MN6, the second selection gate line 214 may form gate electrodes of the first selection transistor MP2, the fourth selection transistor MN4, the fifth selection transistor MP6, and the eighth selection transistor MN8, and the third selection gate line 215 may form gate electrodes of the third selection transistor MP4 and the seventh selection transistor MP8. The row connection wiring 291 may connect the gate electrode of the sixth selection transistor MN6 and the gate electrode of the seventh selection transistor MP8.

The first selection gate line 213 may connect the gate electrode corresponding to a portion of the first second selection gate line 213 of the selection transistor in the first region RG1 and the gate electrode corresponding to another portion of the first selection gate line 213 of the selection transistor in the second region RG2. For example, as illustrated in FIGS. 6 and 7B, the gate electrode of the second selection transistor MN2 in the first region RG1 and the gate electrode of the sixth selection transistor MN6 in the second region RG2 may be connected by the first selection gate line 213. Even though the first selection gate line 213 is cut and separated into the gate segments 213a, 213b, and 213c by the gate cut area CT, the gate electrodes of the second selection transistor MN2 and the sixth selection transistor MN6 may be formed by the same gate segment 213b of the first selection gate line 213.

As illustrated in FIGS. 6 and 7C, the third selection gate line 215 may be cut by the gate cut area CT into the first gate segment 215a and the second gate segment 215b such that the first gate segment 215a may serve as the gate electrode of the third selection transistor MP4 in the first region RG1 and the second gate segment 215b, separate from the first gate segment 215a along the second direction Y, may serve as the gate electrode of the seventh selection transistor MP8 in the second region RG2. The column connection wiring may be formed over the semiconductor substrate and extend in the second direction Y to connect the first gate segment 215a of the third selection gate line 215 and the second gate segment 215b of the third selection gate line 215.

The second selection gate line 214 may connect the gate electrodes corresponding to a portion of the second selection gate line 214 of the selection transistors in the first region RG1 and the gate electrodes corresponding to another portion of the second selection gate line 214 of the selection transistors in the second region RG2. For example, as illustrated in FIGS. 6 and 7D, the second selection gate line 214 may not be cut, e.g., separated, by the gate cut area CT in the first region RG1 and the second region RG2. As a result, all of the gate electrodes of the first and fourth selection transistors MP2 and MN4 in the first region RG1 and the fifth and eighth selection transistors MP6 and MN8 in the second region RG2 may be connected through the second selection gate line 214.

The active areas in both sides of a dummy gate segment may be connected through a jumper structure. For example, as illustrated in FIG. 7E, a jumper structure JMP1 may include the first contacts 234 and 235 and the second contact 245. The jumper structure JMP1 may be formed by combining the first contacts 234 and 235 on the both-side active areas 114 and 115 and the second contact 245 on the gate segment 213a. Using such jumper structure JMP1, the gate segment 213a may be connected to the active areas 114 and 115.

Figure 8:
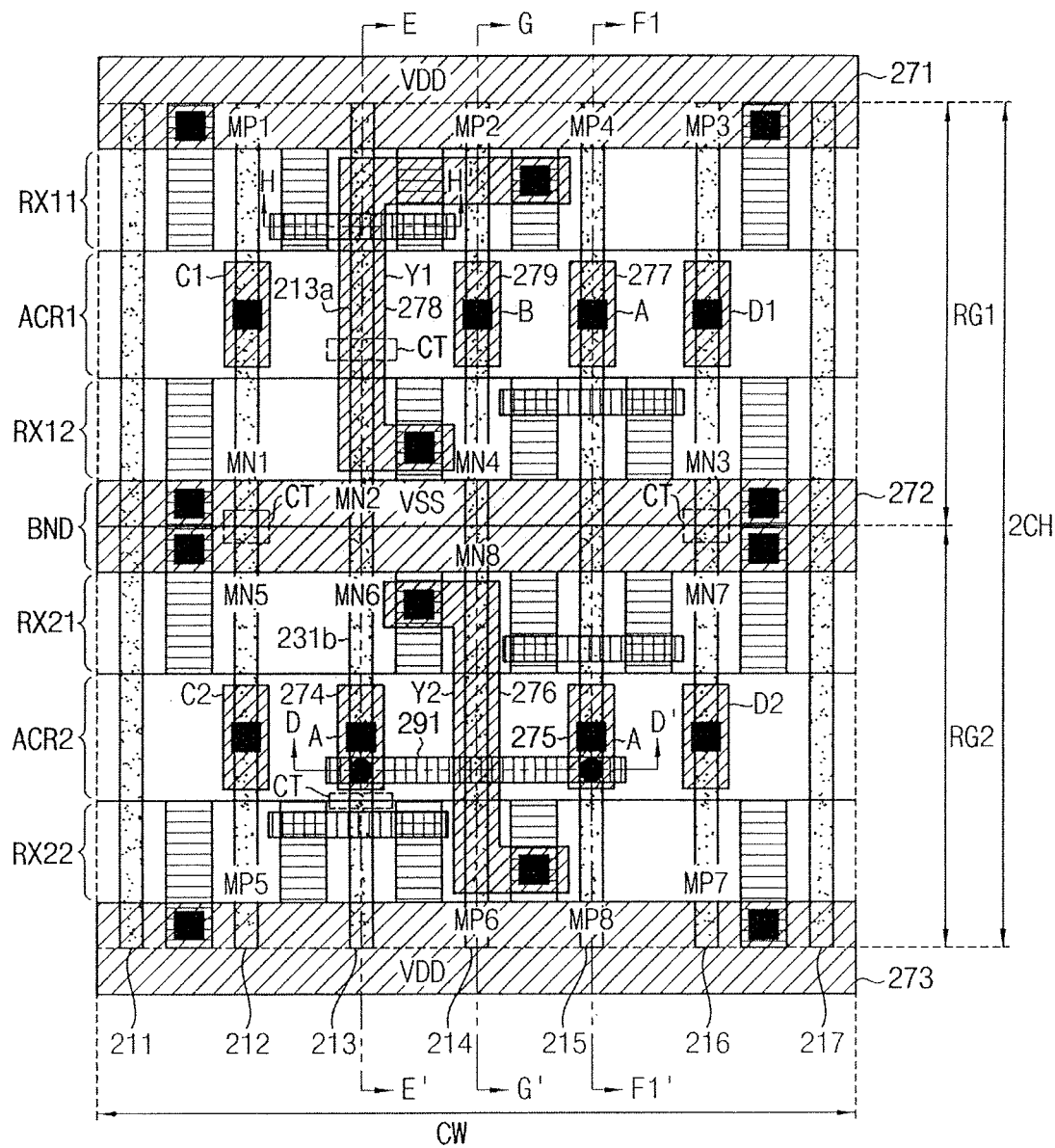
FIG. 8 illustrates a plan view of an example embodiment of a layout of a standard cell corresponding to the integrated circuit of FIG. 5.
Figure 8:
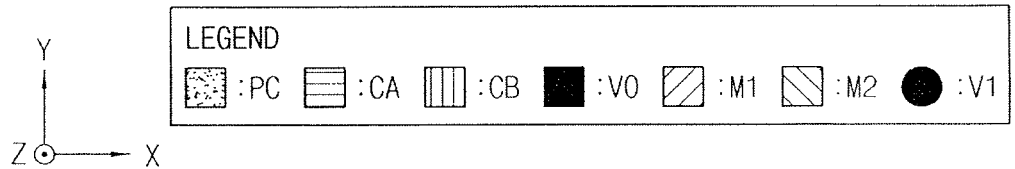
Figure 9B:
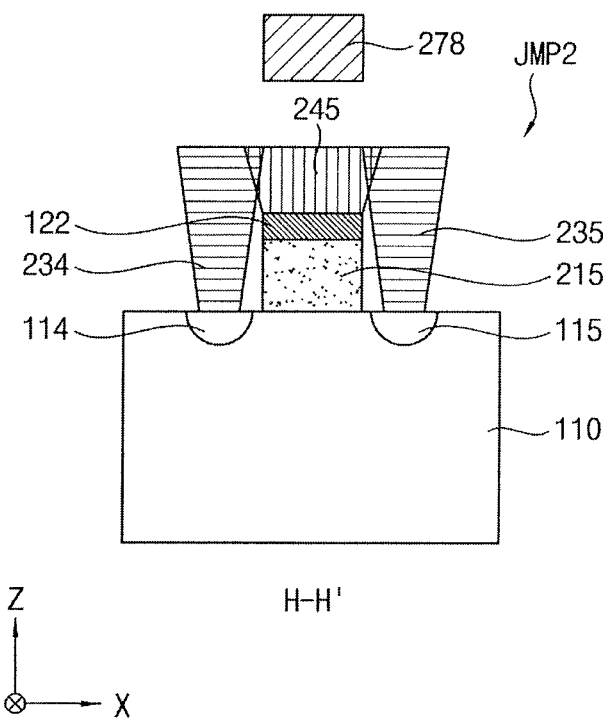

FIG. 8 is a diagram illustrating an example embodiment of a layout of a standard cell corresponding to the integrated circuit of FIG. 5. FIGS. 9A and 9B are cross-sectional views of the standard cell of FIG. 8 according to example embodiments.

A standard cell of FIG. 8 is substantially the same as the standard cell of FIG. 6 except the third selection gate line 215, i.e., except the cross-sectional view of FIG. 7C. Thus the descriptions repeated with FIGS. 6, 7A, 7B, 7D and 7E may be omitted.

The third selection gate line 215 may connect the gate electrode corresponding to a portion of the third selection gate line 215 of the selection transistor in the first region RG1 and the gate electrode corresponding to another portion of the third selection gate line 215 of the selection transistor in the second region RG2. For example, as illustrated in FIGS. 8 and 9A, the third selection gate line 215 may not be cut, e.g., separated, by the gate cut area CT in the first and second regions RG1 and RG2. As a result, the gate electrodes of the third selection transistor MP4 and the seventh selection transistor MP8 may be formed by and connected through the third selection gate line 215.

The active areas in both sides of the third selection gate line 215 may be connected through a jumper structure. For example, as illustrated in FIG. 9B, a jumper structure JMP2 may include the first contacts 234 and 235 and the second contact 245. The jumper structure JMP2 may be formed by combining the first contacts 234 and 235 on the both-side active areas 114 and 115 and the second contact 245 on a gate mask 122. Using such jumper structure JMP2 that is electrically disconnected from the third selection gate line 215 by the gate mask 122, the active areas 114 and 115 in both sides of the third selection gate line 215 may be connected to each other.

In some example embodiments, as described with reference to FIGS. 6 and 7C, the gate segments 215a and 215b of the third selection gate line 215 may be connected using the column connection wiring 292 by adopting the jumper structure JMP1 of FIG. 7E. In other example embodiments, the column connection wiring 292 may be omitted and the entire third selection gate line 215 may be used as the first selection node A by adopting the jumper structure JPM2 of FIG. 9B.

The gate electrode of the second selection transistor MN2 in the first region RG1 and the gate electrode of the sixth selection transistor MN6 in the second region RG2 may be connected by the first selection gate line 213. Even though the first selection gate line 213 is cut and separated into the gate segments 213a, 213b and 213c by the gate cut area CT, the gate electrodes of the second selection transistor MN2 and the sixth selection transistor MN6 may be formed by the same gate segment 213b of the first selection gate line 213.

Figure 10:
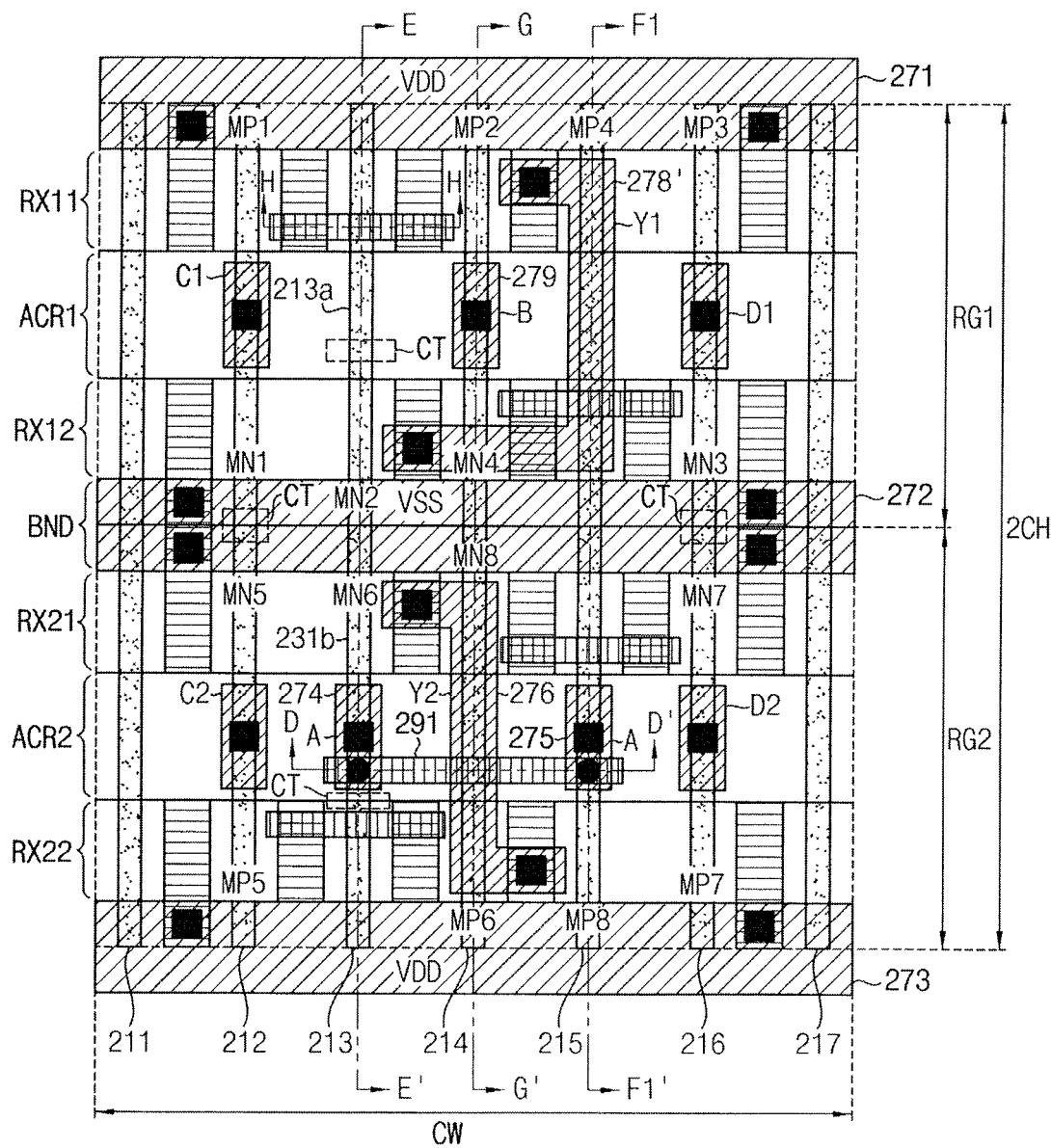
FIGS. 10 and 11 illustrate plan views of example embodiments of a layout of a standard cell corresponding to the integrated circuit of FIG. 5.
Figure 10:
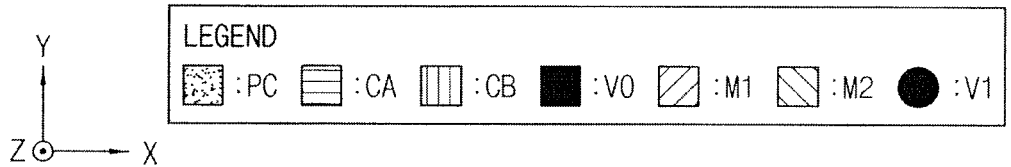
Figure 11:
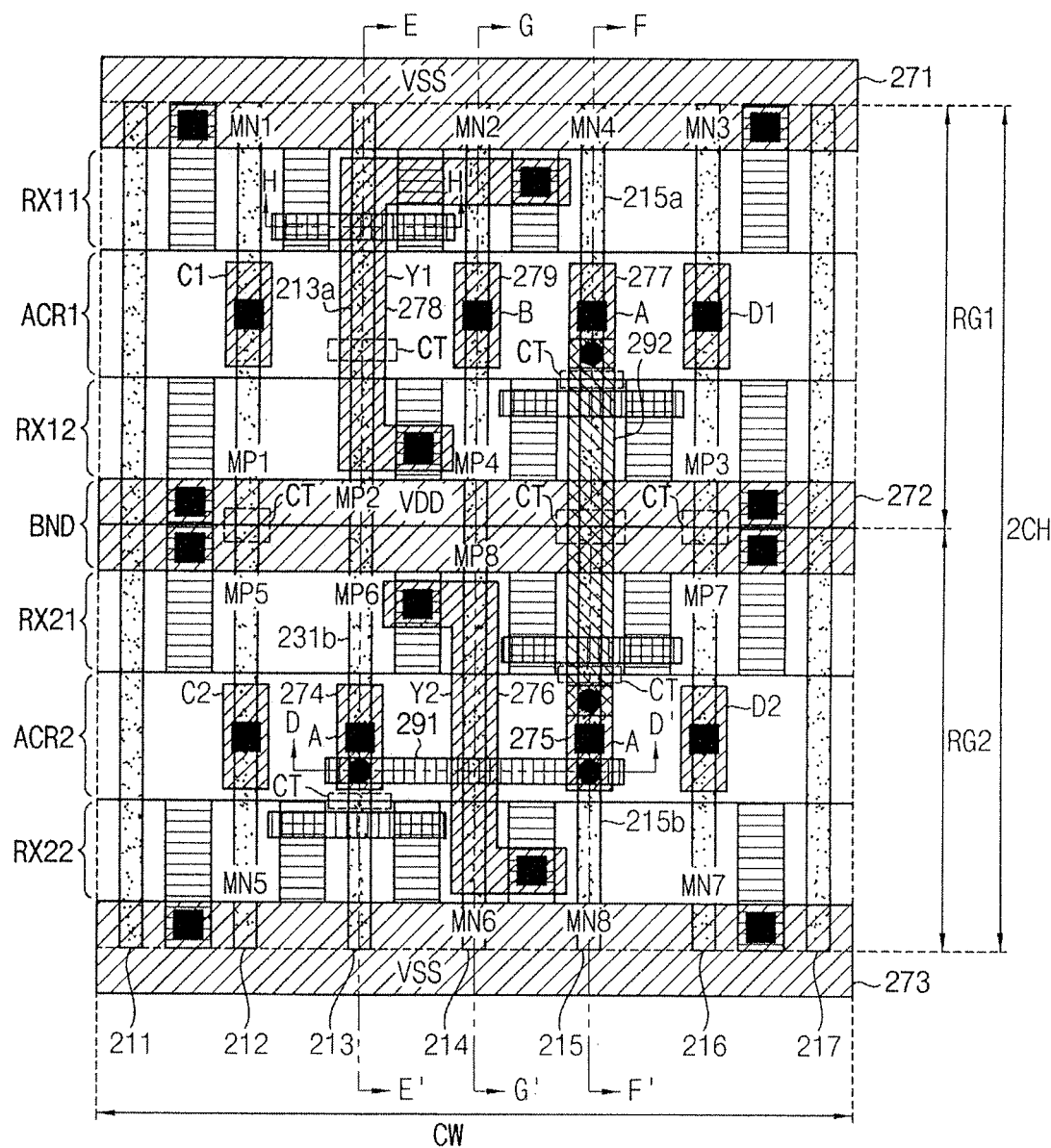

FIGS. 10 and 11 are diagrams illustrating example embodiments of a layout of a standard cell corresponding to the integrated circuit of FIG. 5. A standard cell of FIG. 10 is substantially the same as the standard cell of FIG. 8 except the first output wiring 278' and, thus, the repeated descriptions may be omitted.

The first output wiring 278' has a bilateral symmetry with the first output wiring 278 of FIG. 8. In other words, a portion of the first output wiring 278' of FIG. 10 that extends along the second direction Y is over the third selection gate line 215 along the third selection gate line 215, while a portion of the first output wiring 278 of FIGS. 6 and 8 that extends along the second direction Y is over the first selection gate line 213 along the first selection gate line 213.

As such, the portion of the first output wiring 278 or 278' extending along the second direction Y may be over the first selection gate line 213 or the third selection gate line 215, respectively. Thus, a dummy gate line for the column extending portion extending in the second direction Y may be omitted to reduce the cell width CW.

A standard cell of FIG. 11 is substantially the same as the standard cell of FIG. 6 except the types of the transistors and thus the repeated descriptions may be omitted. As illustrated in FIG. 11, the ground voltage VSS may be applied to the first power rail 271 and the third power rail 273, and the power supply voltage VDD may be applied to the second power rail 272. In this case, the N-type transistors MN1~MN8 may be formed in the first and third device areas RX11 and RX21, and the P-type transistors MN1~MN8 may be formed in the second and fourth device areas RX12 and RX22.

Figure 12:
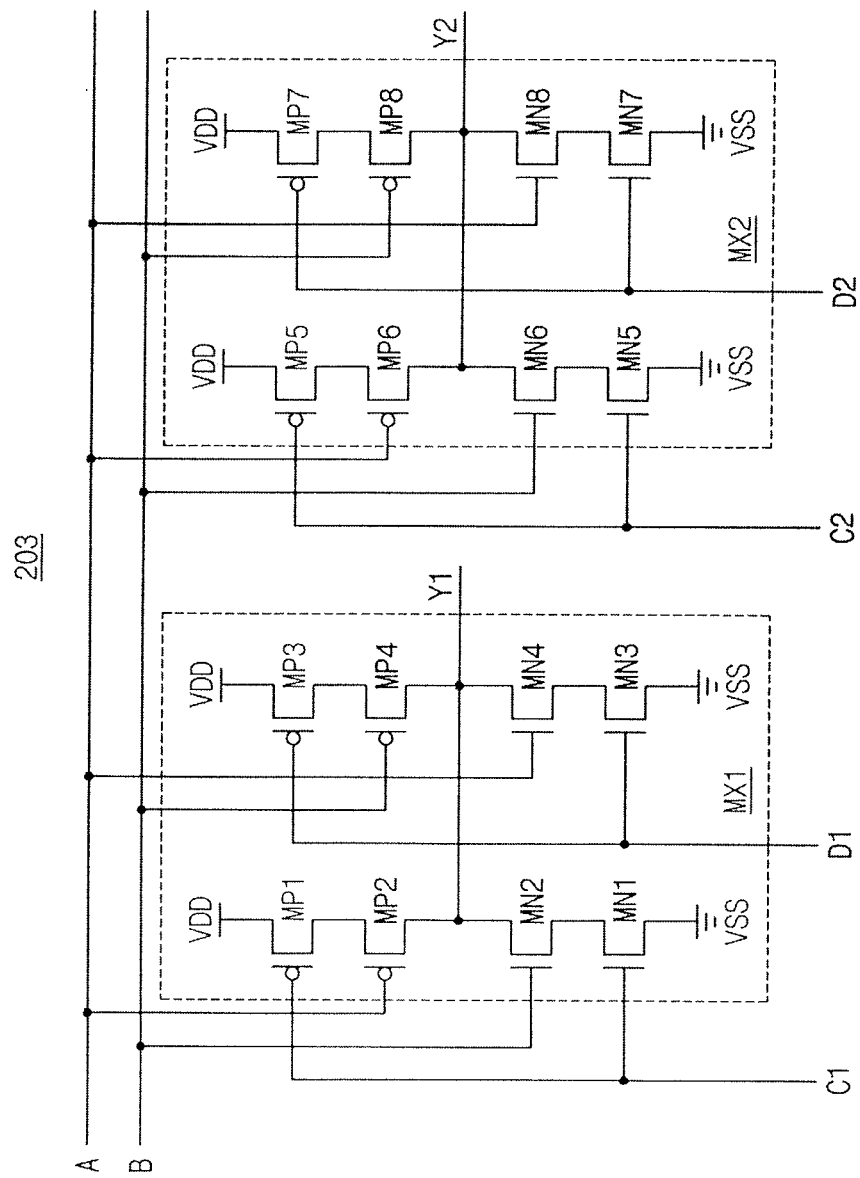
FIG. 12 illustrates a circuit diagram of an integrated circuit according to example embodiments.

FIG. 12 is a circuit diagram illustrating an integrated circuit according to example embodiments. Referring to FIG. 12, an integrated circuit 203 may include the first multiplexer MX1 and the second multiplexer MX2. The first multiplexer MX1 may select one of the first input signal C1 and the second input signal D1, based on the first selection signal A and the second selection signal B, to output the first output signal Y1. The second multiplexer MX2 may select one of the third input signal C2 and the fourth input signal D2, based on the first selection signal A and the second input signal B, to output the second output signal Y2.

The first multiplexer MX1 may include the first input transistor MP1, the second input transistor MN1, the third input transistor MP3, the fourth input transistor MN3, the first selection transistor MP2, the second selection transistor MN2, the third selection transistor MP4, and the fourth selection transistor MN4.

The second multiplexer MX2 may include the fifth input transistor MP5, the sixth input transistor MN5, the seventh input transistor MP7, the eighth input transistor MN7, the fifth selection transistor MP6, the sixth selection transistor MN6, the seventh selection transistor MP8, and the eighth selection transistor MN8.

The integrated circuit 203 of FIG. 12 is substantially the same as the integrated circuit 202 of FIG. 5 except that the first selection signal A and the second selection signal B are switched, and the repeated descriptions may be omitted.

The first selection transistor MP2 is gated by an inverted voltage level of the first selection signal A to pull up a first output node Y1 generating the first output signal Y1. The second selection transistor MN2 is gated by a voltage level of the second selection signal B to pull down the first output node Y1. The third selection transistor MP4 is gated by an inverted voltage level of the second selection signal B to pull up the first output node Y1. The fourth selection transistor MN4 is gated by a voltage level of the first selection signal A to pull down the first output node Y1.

The fifth selection transistor MP6 is gated by the inverted voltage level of the first selection signal A to pull up a second output node Y2 generating the second output signal Y2. The sixth selection transistor MN6 is gated by the voltage level of the second selection signal B to pull down the second output node Y2. The seventh selection transistor MP8 is gated by the inverted voltage level of the second selection signal B to pull up the second output node Y2. The eighth selection transistor MN8 is gated by the voltage level of the first selection signal A to pull down the second output node Y2.

Figure 13:
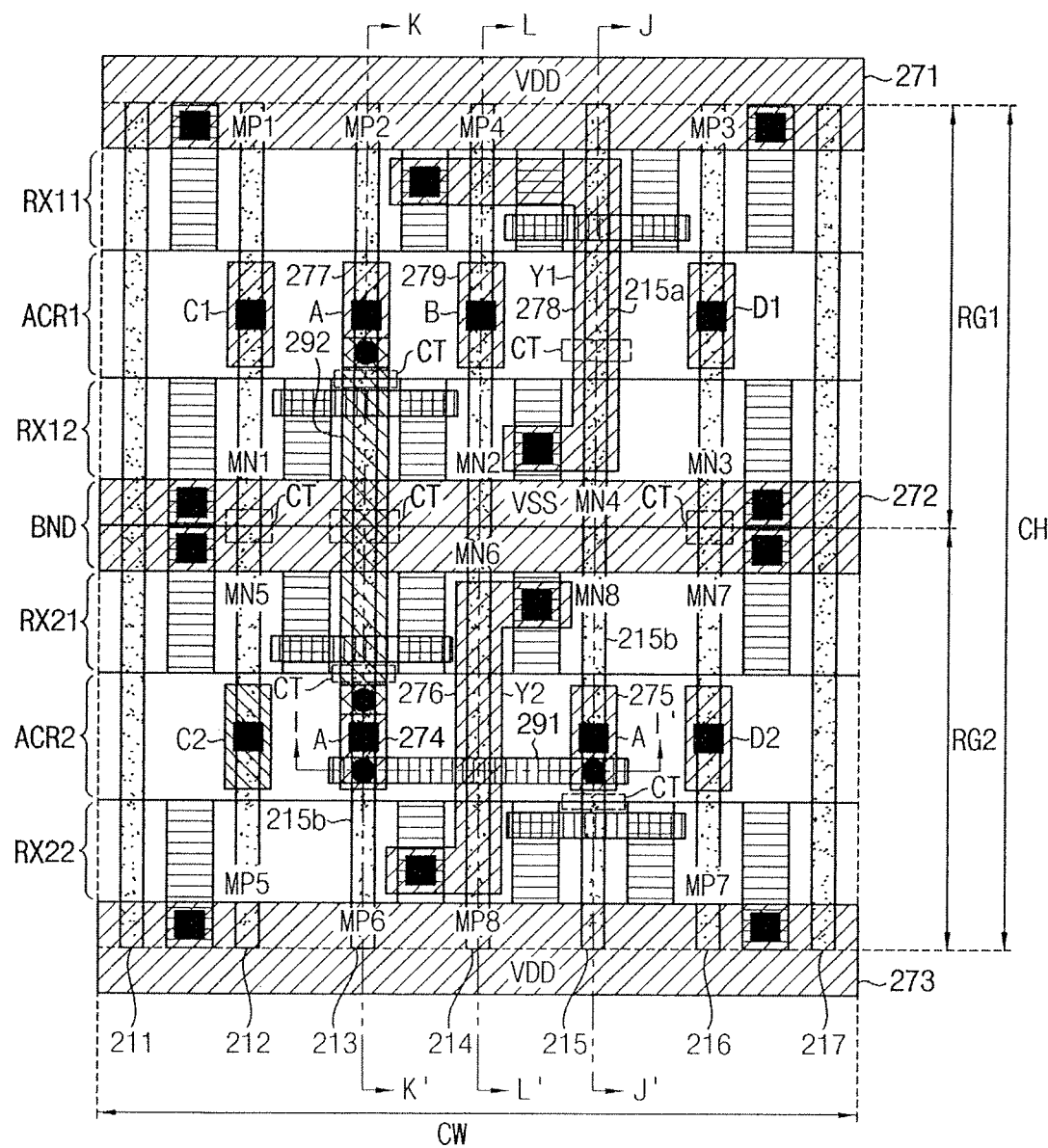
FIGS. 13 and 14 illustrate plan views of example embodiments of a layout of a standard cell corresponding to the integrated circuit of FIG. 12.
Figure 13:
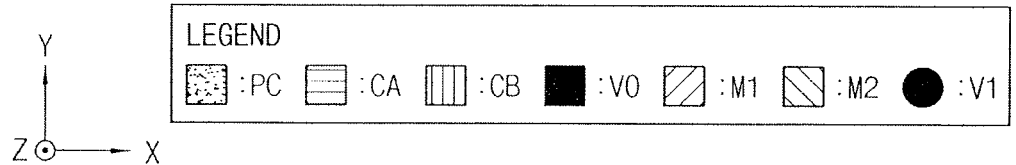
Figure 14:
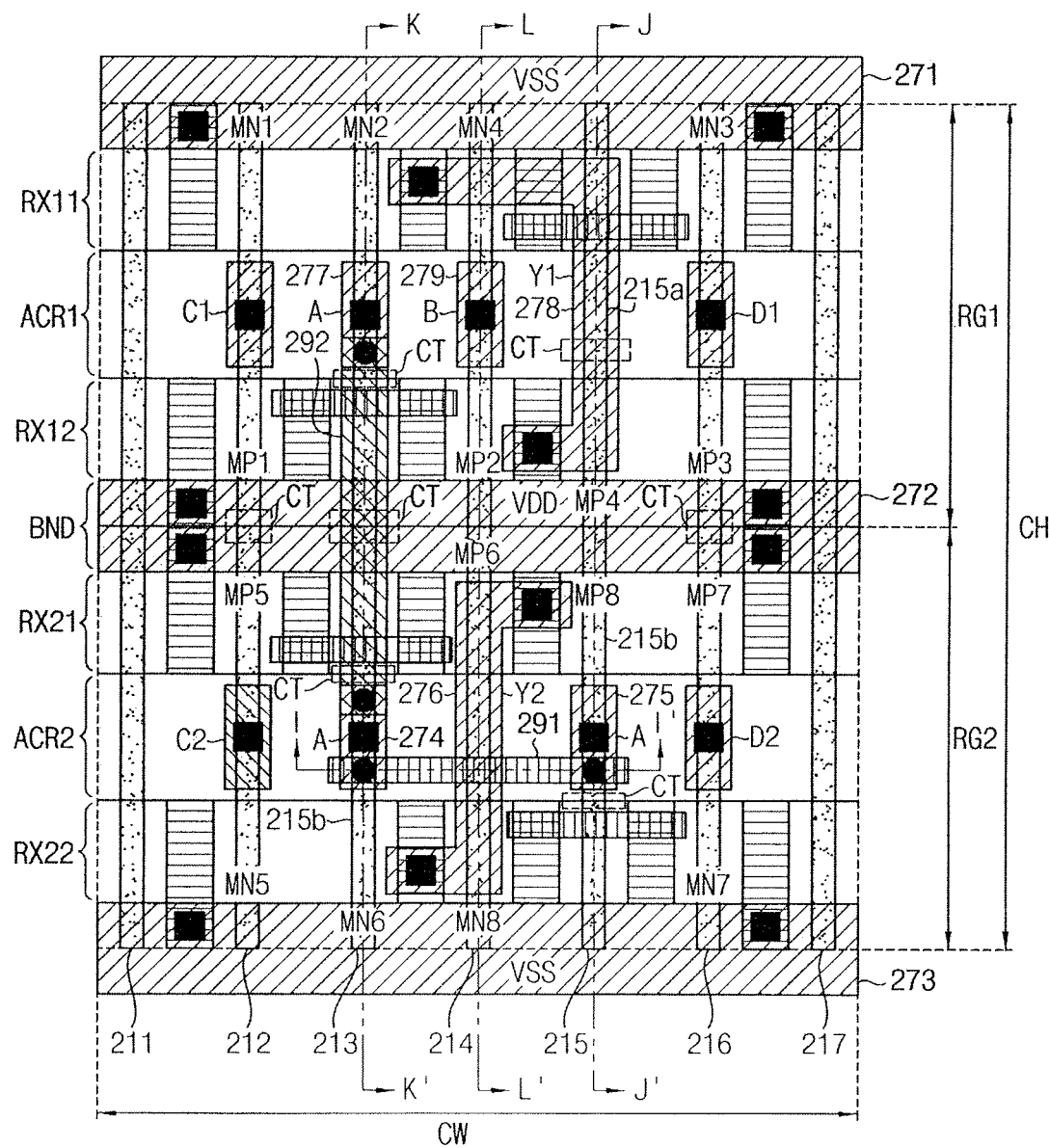
Figure 14:
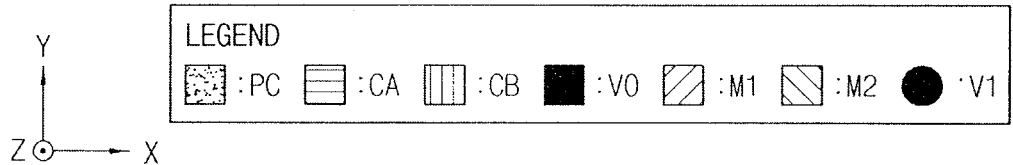

FIGS. 13 and 14 are diagrams illustrating example embodiments of a layout of a standard cell corresponding to the integrated circuit of FIG. 12. A standard cell of FIG. 13 is substantially the same as the standard cell of FIG. 6 and a standard cell of FIG. 14 is substantially the same as the standard cell of FIG. 11. Thus, the repeated descriptions may be omitted.

The standard cell of FIG. 13 has a bilateral symmetry with the standard cell of FIG. 6, first output wiring 278 of FIG. 8. The cross-sectional structure corresponding to a line I-I' is substantially the same as that of FIG. 7A, the cross-sectional structure corresponding to a line J-J' is substantially the same as that of FIG. 7B, the cross-sectional structure corresponding to a line K-K' is substantially the same as that of FIG. 7C, and the cross-sectional structure corresponding to a line L-L' is substantially the same as that of FIG. 7D. The standard cell of FIG. 14 is substantially the same as the standard cell of FIG. 13 except that the P-type and the N-type of the transistors are exchanged.

Figure 15:
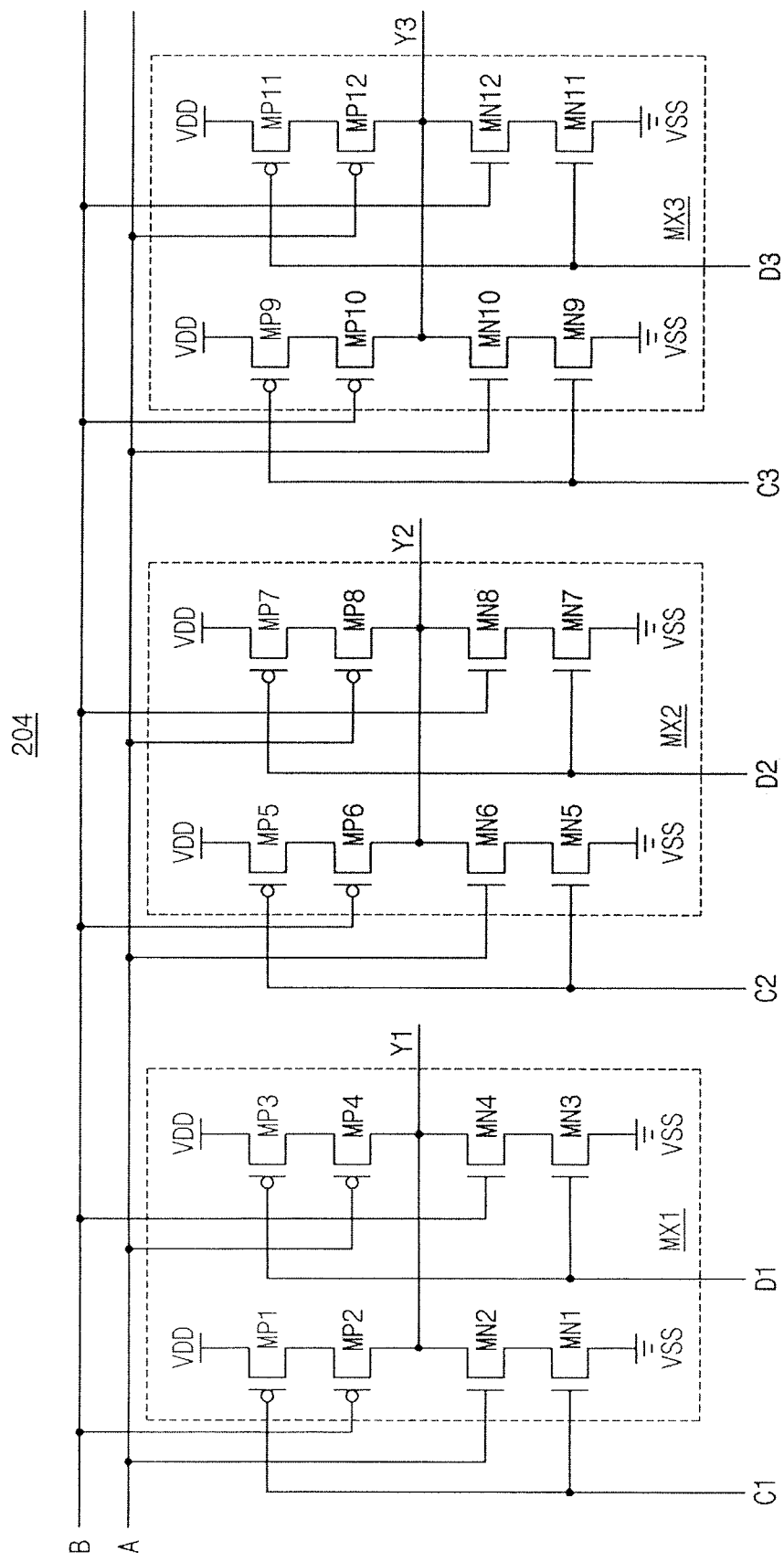
FIG. 15 illustrates a circuit diagram of an integrated circuit according to example embodiments.

FIG. 15 is a circuit diagram illustrating an integrated circuit according to example embodiments. Referring to FIG. 15, an integrated circuit 204 may include the first multiplexer MX1, the second multiplexer MX2, and a third multiplexer MX3 including a plurality of transistors MP1~MP12 and MN1~MN12. The first multiplexer MX1 may select one of the first input signal C1 and the second input signal D1, based on a first selection signal A and a second selection signal B, to output a first output signal Y1. The second multiplexer MX2 may select on of the third input signal C2 and the fourth input signal D2, based on the first selection signal A and the second input signal B, to output the second output signal Y2. The third multiplexer MX3 may select one of a fifth input signal C3 and a sixth input signal D3, based on the first selection signal A and the second selection signal B, to output a third output signal Y3.

The integrated circuit 204 including the three multiplexers MX1, MX2, and MX3 may be implemented as a standard cell such that the above described first, second, and third gate selection lines GL1, GL2, and GL3 in three regions defined by four power rails and adjacent in the second direction Y. As such, the standard cell of FIG. 15 may have a cell height 3CH that is three times a cell height CH of the normal standard cells, and the standard cell of FIG. 15 may be referred to as a triple-height standard cell. In general, a standard cell having a cell height N*CH that is N times (N is an integer greater than one) the normal cell height CH may be referred to as a multi-height standard cell.

Figure 16:
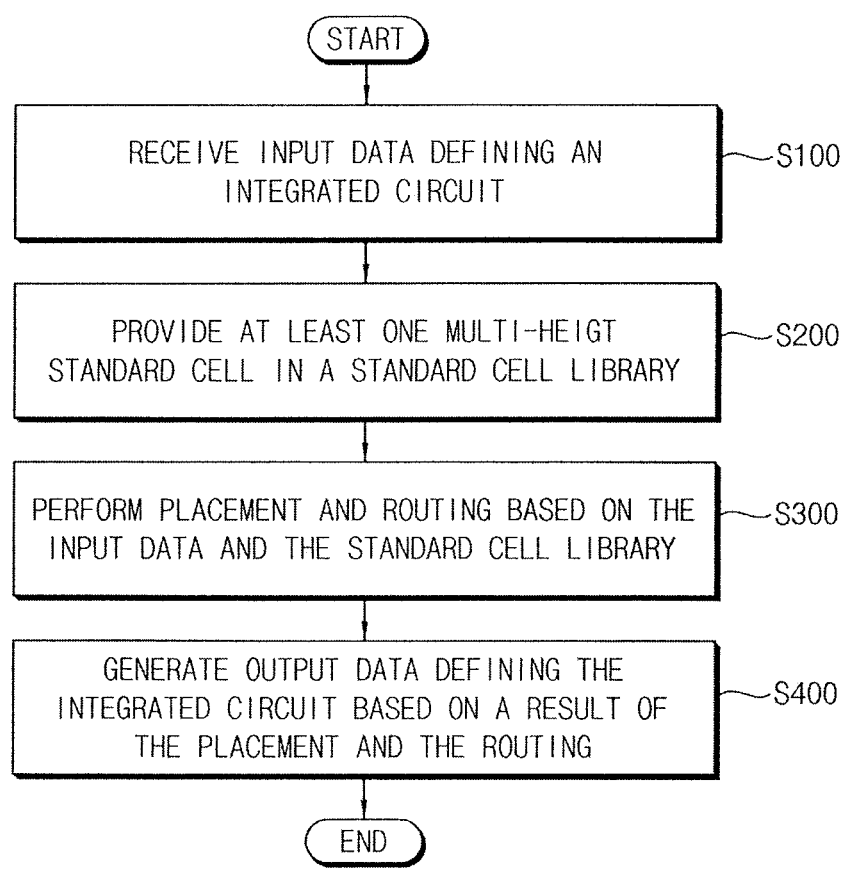
FIG. 16 illustrates a flow chart of a method of designing an integrated circuit according to example embodiments.

FIG. 16 is a diagram illustrating a method of designing an integrated circuit according to example embodiments. The method of FIG. 16 may include a method of designing a layout of the integrated circuit that is performed by a designing tool. In some example embodiments, the designing tool may include a programming software including a plurality of instructions executable by a processor, i.e., software implemented in some form of hardware (e.g. processor, ASIC, etc.).

Referring to FIG. 16, input data defining the integrated circuit may be received (S100). For example, an integrated circuit may be defined by a plurality of cells and the integrated circuit may be designed using a cell library including information of the plurality of cells. Hereinafter, a cell may be a standard cell and a cell library may be a standard cell library.

In some example embodiments, the input data may be data generated from an abstract form with respect to behavior of the integrated circuit. For example, the input data may be defined in a register transfer level (RTL) through synthesis using the standard cell library. For example, the input data may be a bitstream and/or a netlist that is generated by synthesizing the integrated circuit defined by a hardware description language (HDL) such as VHSIC hardware description language (VHDL) or Verilog.

In some example embodiments, the input data may be data for defining the layout of the integrated circuit. For example, the input data may include geometric information for defining a structure implemented as a semiconductor material, a metal, and an insulator. A layout of the integrated circuit indicated by the input data may have a layout of the cells and conducting wires used to connect a cell to other cells, for example.

At least one multi-height standard cell is provided in a standard cell library (S200). The term "standard cell" may refer to a unit of an integrated circuit in which a size of the layout meets a preset or specified rule. The standard cell may include an input pin and an output pin and may process a signal received through the input pin to output a signal through the output pin. For example, the standard cell may be a basic cell such as an AND logic gate, an OR logic gate, a NOR logic gate, or an inverter, a complex cell such as an OR/AND/INVERTER (OAI) or an AND/OR/INVERTER (AOI), and a storage element such as a master-slave flip flop or a latch.

The multi-height standard cell may include the selection nodes implemented by efficient routing of the gate lines and the connection wirings as described with reference to FIGS. 1 through 15.

The standard cell library may include information about a plurality of standard cells. For example, the standard cell library may include a name and a function of a standard cell, as well as timing information, power information, and layout information of the standard cell. The standard cell library may be stored in a storage device and the standard cell library may be provided by accessing the storage device.

Placement and routing are performed based on the input data and the standard cell library (S300) and output data defining the integrated circuit are provided based on a result of the placement and the routing (S400).

In some example embodiments, when the received input data are data such as the bitstream or the netlist generated by synthesizing the integrated circuit, the output data may be the bitstream or the netlist. In other example embodiments, when the received input data are data defining the layout of the integrated circuit, for example, the data having a graphic data system II (GDSII) format, a format of the output data may also be data defining the layout of the integrated circuit.

As such, the method of designing the integrated circuit and the integrated circuit by the method according to example embodiments may reduce an area occupied by the integrated circuit and enhance performance of the integrated circuit using the multi-height standard cell including the selection nodes by efficient routing of the gate lines and the connection wirings.

Figure 17:
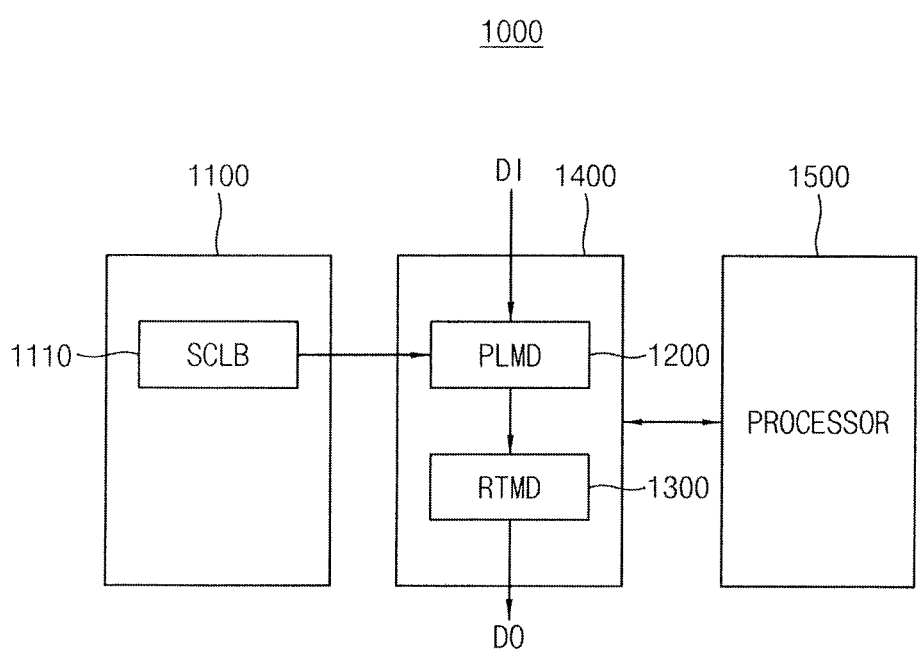
FIG. 17 illustrates a block diagram of a designing system of an integrated circuit according to example embodiments.

FIG. 17 is a block diagram illustrating a designing system of an integrated circuit according to example embodiments. Referring to FIG. 17, a designing system 1000 may include a storage medium 1100, a designing module 1400 and a processor 1500.

The storage medium 1100 (e.g., a storage device) may store a standard cell library SCLB 1110. The standard cell library 1110 may be provided from the storage medium 1100 to the designing module 1400. The standard cell library 1110 may include a plurality of standard cells. The plurality of standard cells may include at least one multi-height standard cell according to example embodiments. The standard cell may be a small, e.g., minimum, unit for designing a block, a device and/or a chip.

The storage medium 1100 may include any computer-readable storage medium used to provide commands and/or data to a computer as a computer-readable storage medium. For example, the computer-readable storage medium 1100 may include volatile memory such as random access memory (RAM), read only memory (ROM), etc. and non-volatile memory such as flash memory, magnetoresistive RAM (MRAM), phase-change RAM (PRAM), resistive RAM (RRAM), etc. The computer-readable storage medium 1100 may be inserted into the computer, may be integrated in the computer, or may be coupled to the computer through a communication medium such as a network and/or a wireless link.

The designing module 1400 may include a placement module PLMD 1200 and a routing module RTMD 1300. Herein, the term "module" may indicate, but is not limited to, a software and/or hardware component, such as a field programmable gate array (FPGA) or an application specific integrated circuit (ASIC), which performs certain tasks. A module may reside in a tangible, addressable storage medium and may execute on one or more processors. For example, a module may include software components, class components, task components, processes, functions, attributes, procedures, subroutines, program code segments, drivers, firmware, micro codes, circuits, data, database, data structures, tables, arrays, parameters, etc. A module may be divided into a plurality of modules performing detailed functions.

The placement module 1200 may, using the processor 1500, arrange standard cells based on input data DI defining the integrated circuit and the standard cell library 1110. The routing module 1300 may perform signal routing with respect to cell placement provided from the placement module 1200. If the routing is not successful, the placement module 1200 may modify the previous cell placement and the routing module 1300 may perform the signal routing with the modified cell placement. When the routing is successfully completed, the routing module 1300 may provide output data DO defining the integrated circuit.

The placement module 1200 and the routing module 1300 may be implemented by a single integrated designing module 1400 or may be implemented by separate and different modules. The integrated designing module 1400 including the placement module 1200 and the routing module 1300 may perform the placement and the routing such that the delay matching and/or the duty ratio adjustment may be implemented in the integrated circuit using the plurality of load standard cells.

The placement module 1200 and/or the routing module 1300 may be implemented in software, but example embodiments are not limited thereto. If the placement module 1200 and the routing module 1300 are implemented in software, they may be stored in the storage medium 1100 as program codes or in other storage mediums.

The processor 1500 may be used when the designing module 1400 performs a computation. In FIG. 17, only one processor 1500 is illustrated. Alternatively, a plurality of processors may be included in the designing system 1000. In addition, the processor 1500 may include cache memories, which increase computation capacity.

As such, the integrated circuit and the method of designing the integrated circuit according to example embodiments may reduce an area occupied by the integrated circuit and enhance performance of the integrated circuit using the multi-height standard cell including the selection nodes by efficient routing of the gate lines and the connection wirings.

Figure 18:
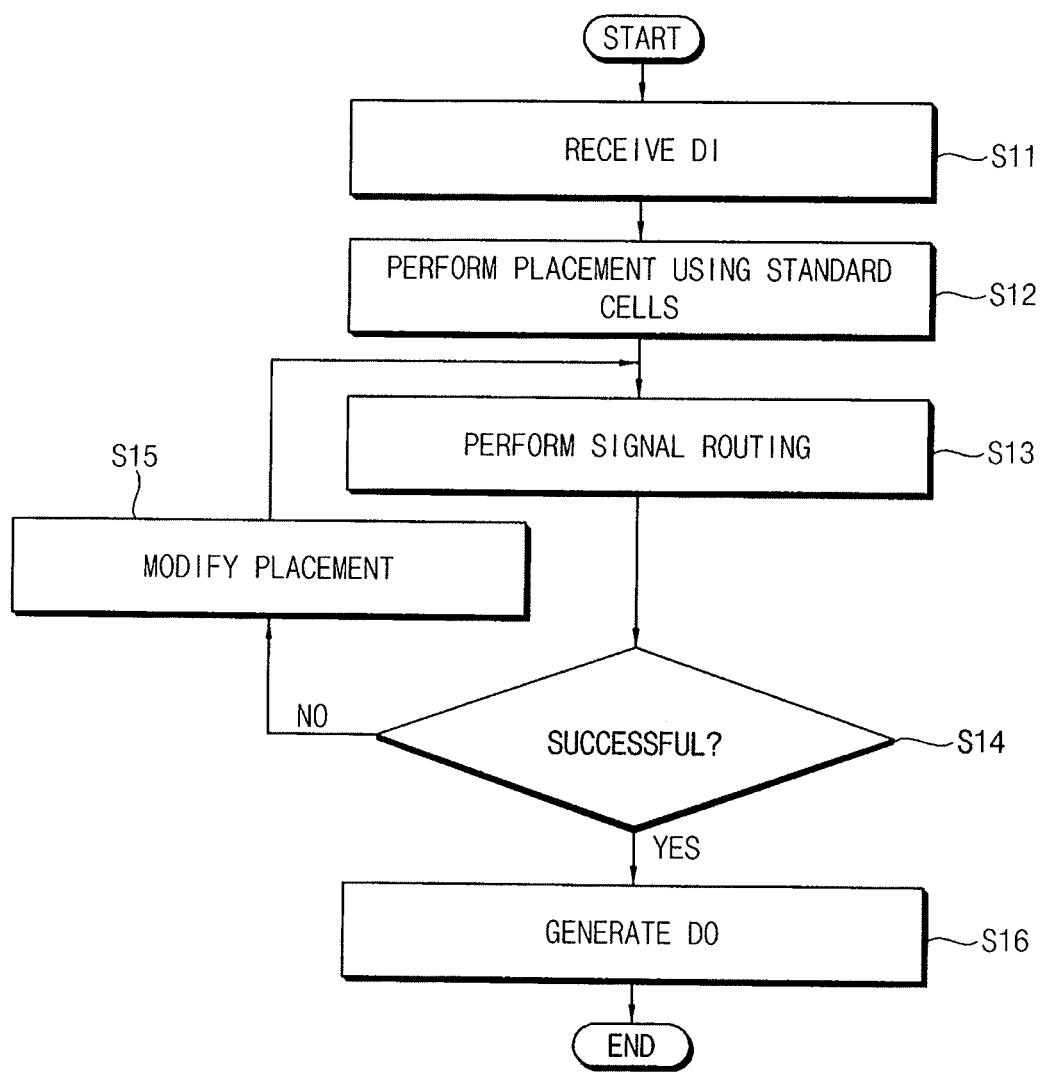
FIG. 18 illustrates a flow chart of an example operation of the designing system of FIG. 2.

FIG. 18 is a flow chart illustrating an example operation of the designing system of FIG. 2. Referring to FIGS. 17 and 18, the designing module 1400 may receive the input data DI defining the integrated circuit (S11). The placement module 1200 may refer to the standard cell library 1110 including at least one multi-height standard cell as described above so as to extract standard cells corresponding to the input data DI, and may perform cell placement using the extracted standard cells (S12). The routing module 1300 may perform signal routing with respect to the placed cells (S13).

When the signal routing is not successful (S14: NO), the placement module 1200 may replace at least one standard cell, e.g. may replace at least one standard cell with another standard cell, to modify the placement of the cells (S15). The routing module 1300 may perform the signal routing again with respect to the modified placement (S13).

As such, the replacement and the routing may be repeated until the signal routing is successfully completed. When the signal routing is successfully completed (S14: YES), the designing module 1400 may generate the output data DO defining the integrated circuit (S16).

Figure 19:
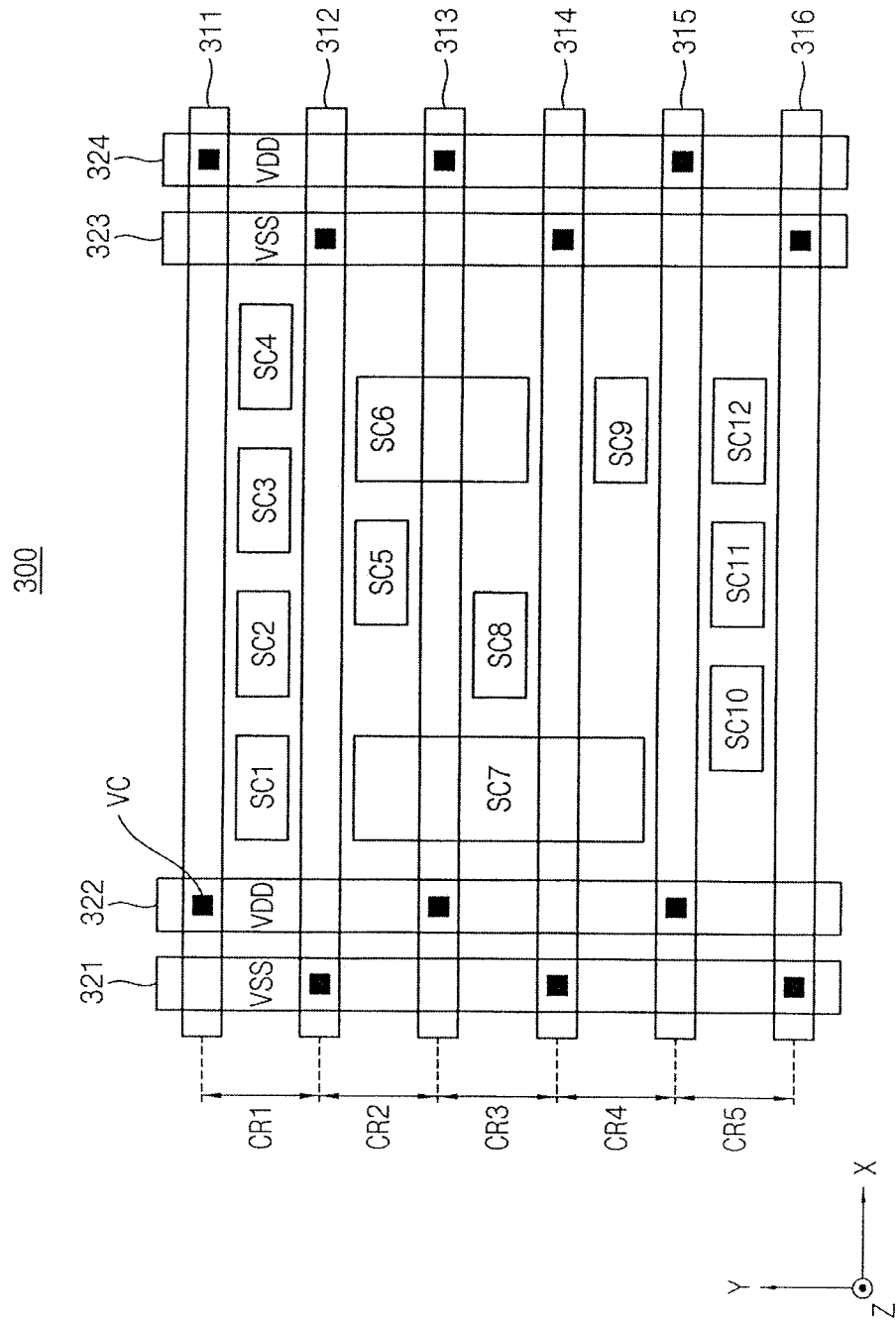
FIG. 19 illustrates a plan view of a layout of an integrated circuit according to example embodiments.

FIG. 19 is a diagram illustrating a layout of an integrated circuit according to example embodiments. An integrated circuit 300 of FIG. 4 may be an application specific integrated circuit (ASIC). A layout of the integrated circuit 300 may be determined by performing the above-described placement and routing of standard cells SC1~SC12. Power may be provided to the standard cells SC1~SC12 through power rails 311~316. The power rails 311~316 may include high power rails 311, 313, and 315 to provide a first power supply voltage VDD, and low power rails 312, 314, and 316 to provide a second power supply voltage VSS lower than the first power supply voltage VDD. For example, the first power supply voltage VDD may have a positive voltage level and the second power supply voltage VSS may have a ground level (e.g., 0V) or a negative voltage level.

The high power rails 311, 313, and 315, and the low power rails 312, 314, and 316 extend in the first direction X and are arranged alternatively one by one in the second direction Y to form boundaries of a plurality of circuit rows CR1~CR5 corresponding to the regions defined by the power rails 311~316 arranged in the second direction Y.

According to some example embodiments, power may be distributed to the power rails 311~316 through power mesh routes 321~324 that extend in the second direction Y. Some power mesh routes 322 and 324 may provide the first power supply voltage VDD and other power mesh routes 321 and 323 may provide the second power supply voltage VSS. The power mesh routes 321~324 may be connected to the power rails 311~316 through vertical contacts VC such as via contacts.

In general, each of the circuit rows CR1~CR5 may be connected to two adjacent power rails that are at boundaries thereof so as to be powered. For example, the standard cells SC1, SC2, SC3, and SC4 in the first circuit row CR1 may be connected to an adjacent and corresponding power rail pair including the high power rail 311 and the low power rail 312.

For example, as illustrated in FIG. 19, the standard cell SC6 may be a double-height standard cell formed in the two circuit rows CR2 and CR3 and the standard cell SC7 may be a triple-height standard cell formed in the three circuit rows C2, C3 and C4. As such, the area occupied by the integrated circuit 300 may be reduced and the performance of the integrated circuit 300 may be enhanced by efficient routing of the single-height standard cells SC1~SC5 and SC8~SC12 and the multi-height standard cells SC6 and SC7.

Figure 20:
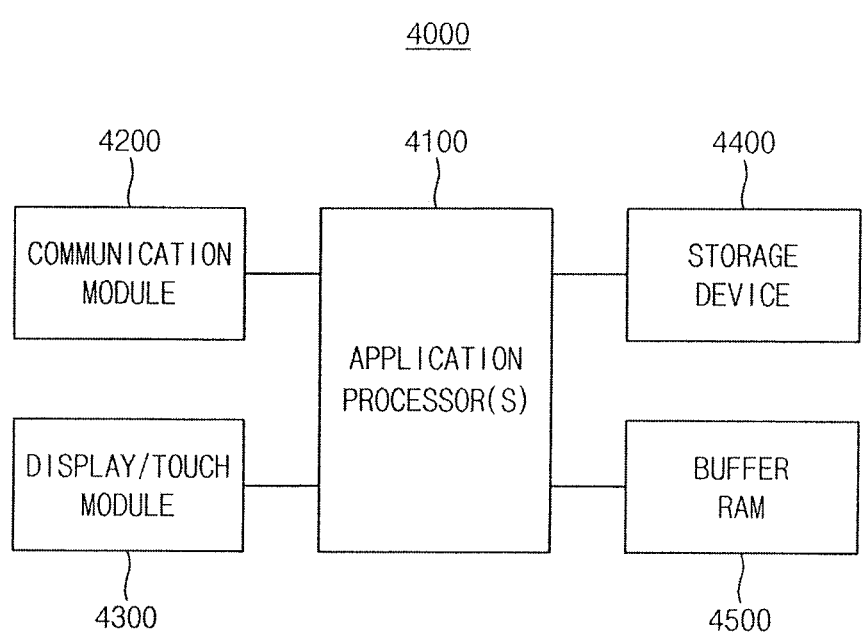
FIG. 20 illustrates a block diagram of a mobile device according to example embodiments.

FIG. 20 is a block diagram illustrating a mobile device according to example embodiments. Referring to FIG. 20, a mobile device 4000 may include at least one application processor 4100, a communication module 4200, a display/touch module 4300, a storage device 4400, and a buffer RAM 4500.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 4000 may include at least one multi-height standard cell according to example embodiments. As described above, a design of the multi-height standard cell may be included in the standard cell library and integrated circuits included in the mobile device 4000 may be designed through automatic placement and routing by a design tool.

As described above, the integrated circuit and the method of designing the integrated circuit according to example embodiments may reduce an area occupied by the integrated circuit and enhance performance of the integrated circuit using the multi-height standard cell including the selection nodes by efficient routing of the gate lines and the connection wirings.

Embodiments may be applied to any electronic devices and systems. For example, embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit, comprising:
a semiconductor substrate;
a first power rail, a second power rail, and a third power rail extending in a first direction and arranged sequentially in a second direction perpendicular to the first direction on the semiconductor substrate;
a first selection gate line, a second selection gate line, and a third selection gate line extending in the second direction over a first region between the first power rail and the second power rail and a second region between the second power rail and the third power rail, and arranged sequentially in the first direction; and
a row connection wiring extending in the first direction to connect the first selection gate line and the third selection gate line, wherein:

the second selection gate line connects first gate electrodes of selection transistors in the first region and second gate electrodes of selection transistors in the second region, the first gate electrodes corresponding to a portion of the second selection gate line and the second gate electrodes corresponding to another portion of the second selection gate line.

2. The integrated circuit as claimed in claim 1, wherein:
the first selection gate line, the third selection gate line, and the row connection wiring form a first selection node receiving a first selection signal, and
the second selection gate line serves as a second selection node receiving a second selection signal.

3. The integrated circuit as claimed in claim 1, wherein the second selection gate line is not cut by a gate cut area in the first and second regions.

4. The integrated circuit as claimed in claim 1, wherein the first selection gate line connects a first gate electrode of a selection transistor in the first region and a second gate electrode of a selection transistor in the second region, the first gate electrode corresponding to a portion of the first selection gate line and the second gate electrode corresponding to another portion of the first selection gate line.

5. The integrated circuit as claimed in claim 1, wherein the third selection gate line is cut by a gate cut area into a first gate segment corresponding to a first gate electrode of a selection transistor in the first region and a second gate segment corresponding to a second gate electrode of a selection transistor in the second region.

6. The integrated circuit as claimed in claim 5, further comprising a column connection wiring extending in the second direction to connect the first gate segment of the third selection gate line and the second gate segment of the third selection gate line.

7. The integrated circuit as claimed in claim 1, wherein the third selection gate line connects a first gate electrode of a selection transistor in the first region and a second gate electrode of a selection transistor in the second region, the first gate electrode corresponding to a portion of the third selection gate line and the second gate electrode corresponding to another portion of the third selection gate line.

8. The integrated circuit as claimed in claim 1, further comprising:
a first multiplexer in the first region, the first multiplexer to select one of a first input signal and a second input signal based on a first selection signal and a second selection signal to output a first output signal; and
a second multiplexer in the second region, the second multiplexer to select one of a third input signal and a fourth input signal based on the first selection signal and the second selection signal to output a second output signal.

9. The integrated circuit as claimed in claim 8, wherein:
the first multiplexer includes a first output wiring in a metal layer and configured to provide the first output signal, and
a column extending portion of the first output wiring is over the first selection gate line or the third selection gate line along the first selection gate line or the third selection gate line.

10. The integrated circuit as claimed in claim 8, wherein:
the second multiplexer includes a second output wiring in a first metal layer and configured to provide the second output signal, and
a column extending portion of the second output wiring is over the second selection gate line along the second selection gate line.

11. The integrated circuit as claimed in claim 10, wherein the row connection wiring is in a second metal layer over the first metal layer.

12. The integrated circuit as claimed in claim 10, wherein the row connection wiring crosses the column extending portion of the second output wiring at a right angle.

13. The integrated circuit as claimed in claim 8, wherein:
the first multiplexer includes:
  a first selection transistor controlled by an inverted voltage level of the second selection signal to pull up a first output node generating the first output signal;
  a second selection transistor to be gated by a voltage level of the first selection signal to pull down the first output node;
  a third selection transistor to be gated by an inverted voltage level of the first selection signal to pull up the first output node; and
  a fourth selection transistor to be gated by a voltage level of the second selection signal to pull down the first output node, and wherein the second multiplexer includes:
  a fifth selection transistor to be gated by the inverted voltage level of the second selection signal to pull up a second output node generating the second output signal;
  a sixth selection transistor to be gated by the voltage level of the first selection signal to pull down the second output node;
  a seventh selection transistor to be gated by the inverted voltage level of the first selection signal to pull up the second output node; and
  an eighth selection transistor to be gated by the voltage level of the second selection signal to pull down the second output node.

14. The integrated circuit as claimed in claim 13, wherein:
the first selection gate line serves as gate electrodes of the second selection transistor and the sixth selection transistor,
the second selection gate line serves as gate electrodes of the first selection transistor, the fourth selection transistor, the fifth selection transistor and the eighth selection transistor, and
the third selection gate line serves as gate electrodes of the third selection transistor and the seventh selection transistor.

15. The integrated circuit as claimed in claim 14, wherein the row connection wiring connects the gate electrode of the sixth selection transistor and the gate electrode of the seventh selection transistor.

16. The integrated circuit as claimed in claim 14, wherein:
the first selection transistor, the third selection transistor, the fifth selection transistor, and the seventh selection transistor are first-type transistors, and
the second selection transistor, the fourth selection transistor, the sixth selection transistor, and the eighth selection transistor are second-type transistors.

17. An integrated circuit, comprising:
a first selection transistor to be gated by an inverted voltage level of a second selection signal to pull up a first output node;
a second selection transistor to be gated by a voltage level of a first selection signal to pull down the first output node;
a third selection transistor to be gated by an inverted voltage level of the first selection signal to pull up the first output node;
a fourth selection transistor to be gated by a voltage level of the second selection signal to pull down the first output node,
a fifth selection transistor to be gated by the inverted voltage level of the second selection signal to pull up a second output node;
a sixth selection transistor to be gated by the voltage level of the first selection signal to pull down the second output node;
a seventh selection transistor to be gated by the inverted voltage level of the first selection signal to pull up the second output node;
an eighth selection transistor to be gated by the voltage level of the second selection signal to pull down the second output node;
a first selection gate line serving as gate electrodes of the second selection transistor and the sixth selection transistor;
a second selection gate line serving as gate electrodes of the first selection transistor, the fourth selection transistor, the fifth selection transistor, and the eighth selection transistor;
a third selection gate line serving as gate electrodes of the third selection transistor and the seventh selection transistor; and
a row connection wiring connecting the first selection gate line and the third selection gate line.

18. The integrated circuit as claimed in claim 17, wherein:
the first output node and the second output node include wirings in a first metal layer, and
the row connection wiring is in a second metal layer different from the first metal layer.

19. An integrated circuit, comprising:
a semiconductor substrate;
a first power rail, a second power rail, and a third power rail extending in a first direction and arranged sequentially in a second direction perpendicular to the first direction on the semiconductor substrate;
a first selection gate line, a second selection gate line, and a third selection gate line extending in the second direction over a first region between the first power rail and the second power rail and a second region between the second power rail and the third power rail, and arranged sequentially in the first direction;
a row connection wiring extending in the first direction to connect the first selection gate line and the third selection gate line;
a first multiplexer in the first region, the first multiplexer to select one of a first input signal and a second input signal based on a first selection signal and a second selection signal to output a first output signal; and
a second multiplexer in the second region, the second multiplexer to select one of a third input signal and a fourth input signal based on the first selection signal and the second selection signal to output a second output signal.

* * * * *